US012701814B2

(12) United States Patent (10) Patent No.: US 12,701,814 B2
Ito (45) Date of Patent: Aug. 4, 2026

(54) IMAGING ELEMENT AND MOTHER GLASS SUBSTRATE

(71) Applicant: Tianma Japan, Ltd., Kawasaki (JP)

(72) Inventor: Hideki Ito, Kawasaki (JP)

(73) Assignee: TIANMA JAPAN, LTD., Kawasaki (JP)

( * ) Notice: Subject to any disclaimer, the term of this patent is extended or adjusted under 35 U.S.C. 154(b) by 65 days.

(21) Appl. No.: 18/964,985

(22) Filed: Dec. 2, 2024

(65) Prior Publication Data

US 2025/0221081 A1 Jul. 3, 2025

(30) Foreign Application Priority Data

Dec. 27, 2023 (JP) ................................. 2023-221231

(51) Int. Cl.
*H10F 39/00* (2025.01)
(52) U.S. Cl.
CPC ....... *H10F 39/811* (2025.01); *H10F 39/8023* (2025.01)
(58) Field of Classification Search
CPC ... H10F 39/802; H10F 39/811; H10F 39/8023
See application file for complete search history.

(56) References Cited

U.S. PATENT DOCUMENTS

| | | | | |
|---|---|---|---|---|
| 2017/0192111 A1* | 7/2017 | Yoon | ........................ | G01T 1/244 |
| 2020/0357754 A1* | 11/2020 | Toyoshima | ......... | H10F 39/8033 |
| 2021/0265402 A1* | 8/2021 | Ono | ...................... | H10F 39/812 |
| 2023/0082187 A1* | 3/2023 | Jun | ......................... | G01T 1/247 |
| | | | | 250/370.09 |
| 2024/0363651 A1* | 10/2024 | Sato | ...................... | H10F 39/802 |

FOREIGN PATENT DOCUMENTS

JP 2023-42500 A 3/2023

* cited by examiner

*Primary Examiner* — Amy R Hsu

(74) *Attorney, Agent, or Firm* — Sughrue Mion, PLLC

(57) ABSTRACT

An imaging element includes an imaging region divided into two regions that are a first region and a second region, and a surrounding region surrounding the imaging region. The imaging element includes, in the first region, a plurality of pixels and wirings each connecting to each of the plurality of pixels, and in the second region, a plurality of pixels and wirings each connecting to each of the plurality of pixels. The imaging element further includes, in the surrounding region, terminals connecting to the wirings. In a case where the imaging element is rotated 180° when viewed from above, the positions of the terminals that connect to the wirings disposed in the first region are switched with the positions of the terminals that connect to the wirings disposed in the second region.

14 Claims, 15 Drawing Sheets

IMAGING ELEMENT AND MOTHER GLASS SUBSTRATE

CROSS-REFERENCE TO RELATED APPLICATIONS

This application claims the benefit of Japanese Patent Application No. 2023-221231, filed on Dec. 27, 2023, the entire disclosure of which is incorporated by reference herein.

FIELD OF THE INVENTION

The present disclosure relates generally to an imaging element and a mother glass substrate.

BACKGROUND OF THE INVENTION

Imaging elements (image sensors) are known that include pixels having photoelectric conversion elements and switching elements. For example, Unexamined Japanese Patent Application Publication No. 2023-42500 describes an X-ray detector panel for video applications that includes a plurality of pixels arranged in a matrix. Each of the pixels includes a readout thin film transistor, a reset thin film transistor, and a photodiode.

The X-ray detector panel for video applications of Unexamined Japanese Patent Application Publication No. 2023-42500 includes a plurality of pixels, a plurality of readout gate pads, a plurality of readout pads, a plurality of reset gate pads, at least one reset drain pad, and a bias pad. Each of the readout gate pads is commonly connected to gates of the readout thin film transistors in the pixels in one row. Each of the readout pads is connected to a drain of the readout thin film transistor in each of the pixels in one row. Each of the reset gate pads is commonly connected to gates of the reset thin film transistors in the pixels in one row. The reset drain pad is commonly connected to drains of the reset thin film transistors in the plurality of pixels. The bias pad is commonly connected to the photodiodes in the plurality of pixels. In Unexamined Japanese Patent Application Publication No. 2023-42500, a line reset operation, a window time operation, and a readout operation are sequentially performed in each row. This prevents time delay between the window time operation and the readout operation to promote high-rate video capturing.

Since the X-ray detector panel for video applications of Unexamined Japanese Patent Application Publication No. 2023-42500 includes the reset gate pads as well as the readout gate pads and the readout pads, a probe bar used in inspection of the X-ray detector panel for video applications needs a large number of probe pins. A probe bar including a large number of probe pins is expensive, and the cost of inspection therewith is thus high.

SUMMARY OF THE INVENTION

An imaging element according to a first aspect of the present disclosure has an imaging region divided in a predetermined first direction into two regions that are a first region and a second region, and a surrounding region surrounding the imaging region, and the imaging element includes:

a plurality of pixels disposed in the imaging region, each of the plurality of pixels including a first switching element, a second switching element, and a photoelectric conversion element, the photoelectric conversion element connecting to a source electrode of the first switching element and a source electrode of the second switching element;

a plurality of first gate wirings disposed in the first region, each of the plurality of first gate wirings connecting to a gate electrode of the first switching element in a pixel included in the plurality of pixels and disposed in the first region, extending in a predetermined second direction, and connecting to each of a plurality of first gate terminals disposed in the surrounding region, the predetermined second direction being perpendicular to the predetermined first direction;

a plurality of first reset gate wirings disposed in the first region, each of the plurality of first reset gate wirings connecting to a gate electrode of the second switching element in the pixel disposed in the first region, extending in the predetermined second direction, and connecting to each of a plurality of first reset gate terminals disposed in the surrounding region;

a plurality of first data wirings disposed in the first region, each of the plurality of first data wirings connecting to a drain electrode of the first switching element in the pixel disposed in the first region, extending in the predetermined first direction, and connecting to each of a plurality of first data terminals disposed in the surrounding region;

a plurality of first reset wirings disposed in the first region, each of the plurality of first reset wirings connecting to a drain electrode of the second switching element in the pixel disposed in the first region, extending in the predetermined first direction, and connecting to a first reset terminal disposed in the surrounding region;

a plurality of first bias wirings disposed in the first region, each of the plurality of first bias wirings connecting to the photoelectric conversion element in the pixel disposed in the first region, extending in the predetermined first direction, and connecting to a first bias terminal disposed in the surrounding region;

a plurality of second gate wirings disposed in the second region, each of the plurality of second gate wirings connecting to a gate electrode of the first switching element in a pixel included in the plurality of pixels and disposed in the second region, extending in the predetermined second direction, and connecting to each of a plurality of second gate terminals disposed in the surrounding region;

a plurality of second reset gate wirings disposed in the second region, each of the plurality of second reset gate wirings connecting to a gate electrode of the second switching element in the pixel disposed in the second region, extending in the predetermined second direction, and connecting to each of a plurality of second reset gate terminals disposed in the surrounding region;

a plurality of second data wirings disposed in the second region, each of the plurality of second data wirings connecting to a drain electrode of the first switching element in the pixel disposed in the second region, extending in the predetermined first direction, and connecting to each of a plurality of second data terminals disposed in the surrounding region;

a plurality of second reset wirings disposed in the second region, each of the plurality of second reset wirings connecting to a drain electrode of the second switching element in the pixel disposed in the second region, extending in the predetermined first direction, and connecting to a second reset terminal disposed in the surrounding region; and

a plurality of second bias wirings disposed in the second region, each of the plurality of second bias wirings connecting to the photoelectric conversion element in the pixel disposed in the second region, extending in the predetermined first direction, and connecting to a second bias terminal disposed in the surrounding region, wherein the plurality of first gate terminals and the plurality of first reset gate terminals are disposed on opposite sides of the surrounding region sandwiching the first region, the plurality of second gate terminals and the plurality of second reset gate terminals are disposed on opposite sides of the surrounding region sandwiching the second region, the plurality of first gate terminals and the plurality of second reset gate terminals are disposed on a same side of the surrounding region with respect to the imaging region, the plurality of first reset gate terminals and the plurality of second gate terminals are disposed on a same side of the surrounding region with respect to the imaging region, and in a case where the imaging element is rotated 180° when viewed from above, positions of the plurality of first gate terminals are switched with positions of the plurality of second gate terminals, positions of the plurality of first reset gate terminals are switched with positions of the plurality of second reset gate terminals, positions of the plurality of first data terminals are switched with positions of the plurality of second data terminals, a position of the first reset terminal is switched with a position of the second reset terminal, and a position of the first bias terminal is switched with a position of the second bias terminal.

A mother glass substrate according to a second aspect of the present disclosure has an imaging region divided in a predetermined first direction into two regions that are a first region and a second region, a surrounding region surrounding the imaging region, and an inspection terminal region surrounding the surrounding region, and the mother glass substrate includes:

a plurality of pixels disposed in the imaging region, each of the plurality of pixels including a first switching element, a second switching element, and a photoelectric conversion element, the photoelectric conversion element connecting to a source electrode of the first switching element and a source electrode of the second switching element;

a plurality of first gate wirings disposed in the first region, each of the plurality of first gate wirings connecting to a gate electrode of the first switching element in a pixel included in the plurality of pixels and disposed in the first region, extending in a predetermined second direction, and connecting to each of a plurality of first gate terminals disposed in the surrounding region, the predetermined second direction being perpendicular to the predetermined first direction;

a plurality of first reset gate wirings disposed in the first region, each of the plurality of first reset gate wirings connecting to a gate electrode of the second switching element in the pixel disposed in the first region, extending in the predetermined second direction, and connecting to each of a plurality of first reset gate terminals disposed in the surrounding region;

a plurality of first data wirings disposed in the first region, each of the plurality of first data wirings connecting to a drain electrode of the first switching element in the pixel disposed in the first region, extending in the predetermined first direction, and connecting to each of a plurality of first data terminals disposed in the surrounding region;

a plurality of first reset wirings disposed in the first region, each of the plurality of first reset wirings connecting to a drain electrode of the second switching element in the pixel disposed in the first region, extending in the predetermined first direction, and connecting to a first reset terminal disposed in the surrounding region;

a plurality of first bias wirings disposed in the first region, each of the plurality of first bias wirings connecting to the photoelectric conversion element in the pixel disposed in the first region, extending in the predetermined first direction, and connecting to a first bias terminal disposed in the surrounding region;

a plurality of second gate wirings disposed in the second region, each of the plurality of second gate wirings connecting to a gate electrode of the first switching element in a pixel included in the plurality of pixels and disposed in the second region, extending in the predetermined second direction, and connecting to each of a plurality of second gate terminals disposed in the surrounding region;

a plurality of second reset gate wirings disposed in the second region, each of the plurality of second reset gate wirings connecting to a gate electrode of the second switching element in the pixel disposed in the second region, extending in the predetermined second direction, and connecting to each of a plurality of second reset gate terminals disposed in the surrounding region;

a plurality of second data wirings disposed in the second region, each of the plurality of second data wirings connecting to a drain electrode of the first switching element in the pixel disposed in the second region, extending in the predetermined first direction, and connecting to each of a plurality of second data terminals disposed in the surrounding region;

a plurality of second reset wirings disposed in the second region, each of the plurality of second reset wirings connecting to a drain electrode of the second switching element in the pixel disposed in the second region, extending in the predetermined first direction, and connecting to a second reset terminal disposed in the surrounding region;

a plurality of second bias wirings disposed in the second region, each of the plurality of second bias wirings connecting to the photoelectric conversion element in the pixel disposed in the second region, extending in the predetermined first direction, and connecting to a second bias terminal disposed in the surrounding region;

a first reset gate inspection terminal connecting to the plurality of first reset gate terminals and disposed in the inspection terminal region;

a plurality of first data inspection terminals disposed in the inspection terminal region, each of the plurality of first data inspection terminals connecting to each of the plurality of first data terminals;

a first reset inspection terminal connecting to the first reset terminal and disposed in the inspection terminal region;

a first bias inspection terminal connecting to the first bias terminal and disposed in the inspection terminal region;

a second reset gate inspection terminal connecting to the plurality of second reset gate terminals and disposed in the inspection terminal region;

a plurality of second data inspection terminals disposed in the inspection terminal region, each of the plurality of second data inspection terminals connecting to each of the plurality of second data terminals;

a second reset inspection terminal connecting to the second reset terminal and disposed in the inspection terminal region; and a second bias inspection terminal connecting to the second bias terminal and disposed in the inspection terminal region, wherein the plurality of first data terminals, the first reset terminal, and the first bias terminal are disposed on a first region side of the surrounding region, the first region side being included in opposite sides of the surrounding region sandwiching the first region and the second region, the plurality of second data terminals, the second reset terminal, and the second bias terminal are disposed on a second region side of the surrounding region, the second region side being included in the opposite sides of the surrounding region sandwiching the first region and the second region, the plurality of first gate terminals and the plurality of first reset gate terminals are disposed on opposite sides of the surrounding region sandwiching the first region, the plurality of second gate terminals and the plurality of second reset gate terminals are disposed on opposite sides of the surrounding region sandwiching the second region, the plurality of first gate terminals and the plurality of second reset gate terminals are disposed on a same side of the surrounding region with respect to the imaging region, and the plurality of first reset gate terminals and the plurality of second gate terminals are disposed on a same side of the surrounding region with respect to the imaging region, the plurality of first data inspection terminals, the first reset inspection terminal, and the first bias inspection terminal are respectively disposed outside the plurality of first data terminals, the first reset terminal, and the first bias terminal, the plurality of second data inspection terminals, the second reset inspection terminal, and the second bias inspection terminal are respectively disposed outside the plurality of second data terminals, the second reset terminal, and the second bias terminal, the plurality of first reset gate inspection terminals are disposed juxtaposed to the plurality of first data inspection terminals, the first reset inspection terminal, and the first bias inspection terminal, the plurality of second reset gate inspection terminals are disposed juxtaposed to the plurality of second data inspection terminals, the second reset inspection terminal, and the second bias inspection terminal, and in a case where the mother glass substrate is rotated 180° when viewed from above, positions of the plurality of first data inspection terminals are switched with positions of the plurality of second data inspection terminals, a position of the first reset inspection terminal is switched with a position of the second reset inspection terminal, a position of the first bias inspection terminal is switched with a position of the second bias inspection terminal, and positions of the plurality of first reset gate inspection terminals are switched with positions of the plurality of second reset gate inspection terminals.

It is to be understood that both the foregoing general description and the following detailed description are exemplary and explanatory and are not restrictive of this disclosure.

BRIEF DESCRIPTION OF DRAWINGS

A more complete understanding of this application can be obtained when the following detailed description is considered in conjunction with the following drawings, in which:

FIG. 1 is a schematic drawing illustrating an imaging element according to Embodiment 1;

FIG. 10 is a schematic drawing illustrating the element substrate and a circuit substrate according to Embodiment 1;

DETAILED DESCRIPTION OF THE INVENTION

An imaging element and an imaging element substrate according to embodiments are described below with reference to the drawings.

Embodiment 1

Figure 1:
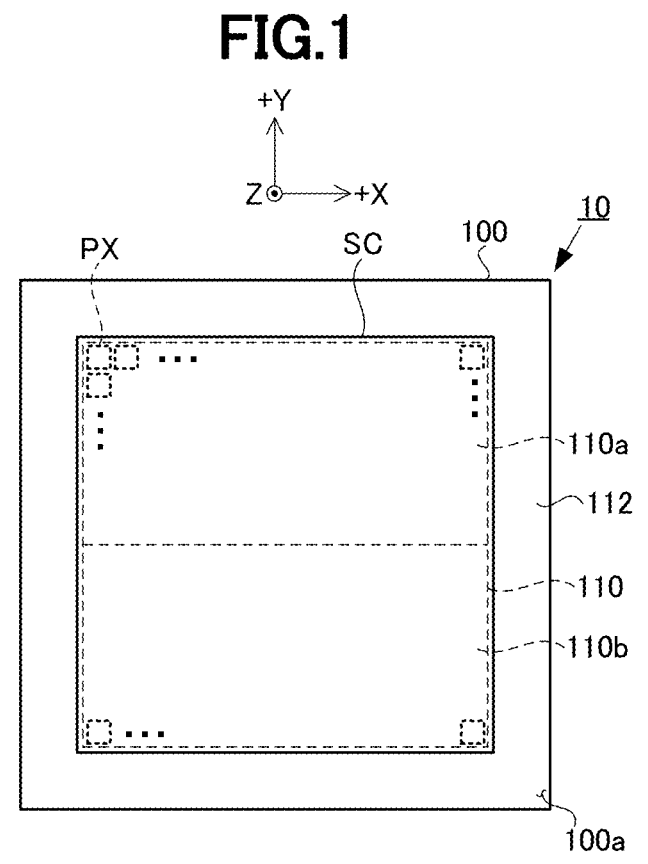

An imaging element 10 according to the present embodiment is described with reference to FIGS. 1 to 10. The imaging element 10 captures X-ray images. As illustrated in FIG. 1, the imaging element 10 includes an element substrate 100 and a scintillator SC. The element substrate 100 has an imaging region 110 and a surrounding region 112. The scintillator SC is disposed on the imaging region 110 of the element substrate 100. The scintillator SC is formed from a fluorescent material, and converts X-rays to visible light.

Figure 2:
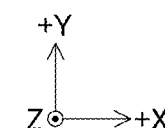
FIG. 2 is a plan view illustrating an element substrate according to Embodiment 1.

As illustrated in FIGS. 1 and 2, the element substrate 100 of the imaging element 10 has the imaging region 110 and the surrounding region 112 on a main surface 100a. In one example, the element substrate 100 is implemented as a glass substrate. In the present description, to facilitate understanding, a description is given in which, in FIG. 2, the right direction of the element substrate 100 is referred to as the "+X direction", the up direction is referred to as the "+Y direction", and the direction perpendicular to the +X direction and the +Y direction is referred to as the "+Z direction."

The imaging region 110 is equally divided in the Y direction into two regions that are a first region 110a and a second region 110b. The surrounding region 112 surrounds the imaging region 110. The Y direction corresponds to a predetermined first direction.

As illustrated in FIG. 2, the element substrate 100 includes pixels PX (pixels PX1, PX2), wirings including first gate wirings 132, first data wirings 152, second gate wirings 232, and other wirings, and terminals including first gate terminals 132P, first data terminals 152P, second gate terminals 232P, and other terminals. In the present embodiment, the first gate wirings 132, the first data wirings 152, and the other wirings are collectively referred to as the "wirings". Each of the wirings directly connects to any of a first switching element 122, a second switching element 124, and a photoelectric conversion element E1 in each of the pixels PX, which are described later. Additionally, the first gate terminals 132P, the first data terminals 152P, and the other terminals are collectively referred to as the "terminals". The terminals connect to the wirings via connection wirings 190. The terminals are electrodes (pads) for connecting the wirings to outside the element substrate 100. The phrase "outside the element substrate 100" refers to a device, a member, a drive circuit, a drive integrated circuit (IC) or the like other than the element substrate 100.

Firstly, the pixels PX of the element substrate 100 are described. The pixels PX are arranged in a matrix in the imaging region 110. In the present embodiment, the pixels PX1 are defined as the pixels PX disposed in the first region 110a of the imaging region 110, and the pixels PX2 are defined as the pixels PX disposed in the second region 110b of the imaging region 110.

Figure 3:
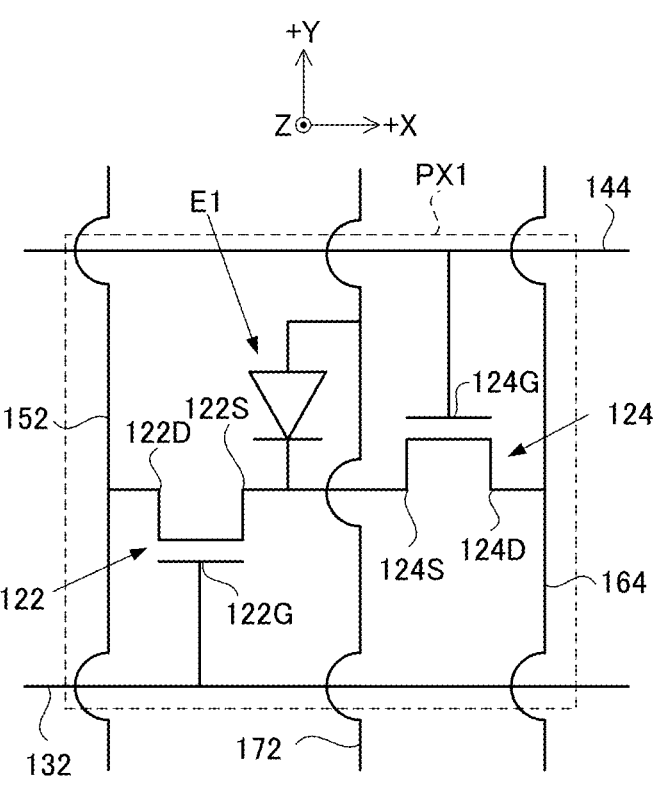
FIG. 3 is a drawing illustrating a pixel disposed in a first region according to Embodiment 1.
Figure 4:
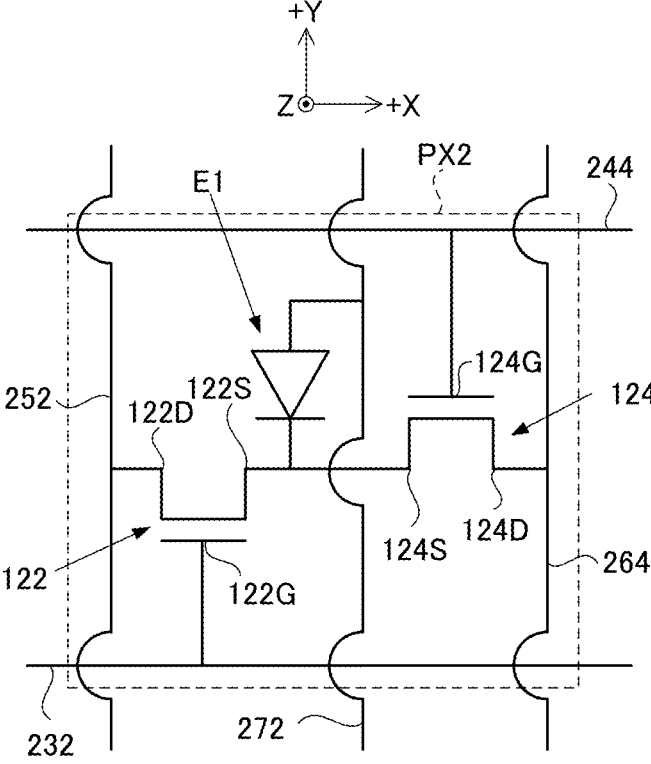
FIG. 4 is a drawing illustrating a pixel disposed in a second region according to Embodiment 1.

As illustrated in FIGS. 2 to 4, each of the pixels PX (the pixels PX1, PX2) has the photoelectric conversion element E1, the first switching element 122, and the second switching element 124. In one example, the photoelectric conversion element E1 is implemented as a personal identification number (PIN) photodiode. In one example, the first switching element 122 and the second switching element 124 are implemented as thin film transistor (TFT) elements. The first switching element 122 is a switching element for reading a charge of the photoelectric conversion element E1. The second switching element 124 is a switching element for resetting a residual charge in the pixel PX.

The photoelectric conversion element (the PIN photodiode) E1 accumulates the charge in accordance with an amount of the visible light converted from the X-rays by the scintillator. The photoelectric conversion element E1 includes a cathode electrodes, an n-type amorphous silicon layer, an intrinsic amorphous silicon layer, a p-type amorphous silicon layer, and an anode electrode (all not illustrated in the drawings). The n-type amorphous silicon layer is formed on the cathode electrode. The intrinsic amorphous silicon layer is formed on the n-type amorphous silicon layer. The p-type amorphous silicon layer is formed on the intrinsic amorphous silicon layer. The anode electrode is formed on the p-type amorphous silicon layer. The cathode electrode is formed from chrome (Cr), molybdenum, aluminum, or the like, and connects to a source electrode 122S of the first switching element 122 and a source electrode 124S of the second switching element 124. In one example, the anode electrode is formed from indium tin oxide (ITO). The anode electrode of the photoelectric conversion element E1 in the pixel PX1 connects to a first bias wiring 172 (FIG. 3), and the anode electrode of the photoelectric conversion element E1 in the pixel PX2 connects to a second bias wiring 272 (FIG. 4).

The first switching elements 122 are sequentially driven based on scanning signals described later. These scanning signals are supplied from the first gate wirings 132 or the second gate wirings 232. Each first switching element 122 includes a gate electrode 122G, the source electrode 122S, a drain electrode 122D, a semiconductor layer (not illustrated in the drawings), and an insulating layer (not illustrated in the drawings). The gate electrode 122G, the source electrode 122S, and the drain electrode 122D are formed from a metal such as aluminum, molybdenum, or the like. The semiconductor layer is formed from amorphous silicon, an oxide including indium (In), gallium (Ga), and zinc (Zn), or the like. The source electrode 122S connects to the cathode electrode of the photoelectric conversion element E1. The gate electrode 122G of the first switching element 122 in the pixel PX1 connects to each first gate wiring 132 (FIG. 3), and the gate electrode 122G of the first switching element 122 in the pixel PX2 connects to each second gate wiring 232 (FIG. 4). The drain electrode 122D of the first switching element 122 in the pixel PX1 connects to each first data wiring 152 (FIG. 3), and the drain electrode 122D of the first switching element 122 in the pixel PX2 connects to each second data wiring 252 (FIG. 4).

The second switching elements 124 are sequentially driven based on scanning signals described later. These scanning signals are supplied from first reset gate wirings 144 or second reset gate wirings 244. The second switching elements 124 includes a gate electrode 124G, the source electrode 124S, a drain electrode 124D, a semiconductor layer (not illustrated in the drawings), and an insulating layer (not illustrated in the drawings). The source electrode 124S connects to the cathode electrode of the photoelectric conversion element E1. The gate electrode 124G of the second switching element 124 in the pixel PX1 connects to each first reset gate wiring 144 (FIG. 3), and the gate electrode 124G of the second switching element 124 in the pixel PX2 connects to each second reset gate wiring 244 (FIG. 4). The drain electrode 124D of the second switching element 124 in the pixel PX1 connects to each first reset wiring 164 (FIG. 3), and the drain electrode 124D of the second switching element 124 in the pixel PX2 connects to each second reset wiring 264 (FIG. 4). The other configurations of the second switching element 124 of the present embodiment are the same as the first switching element 122.

The wirings of the element substrate 100 are described. The wirings are formed from a metal such as aluminum (Al), molybdenum (Mo), or the like.

Firstly, the wirings disposed in the first region 110a of the imaging region 110 are described. As illustrated in FIG. 2, the first gate wirings 132, the first reset gate wirings 144, the first data wirings 152, the first reset wirings 164, and the first bias wirings 172 are disposed in the first region 110a.

The first gate wiring 132 supplies the scanning signal to the gate electrode 122G of the first switching element 122.

The first gate wirings 132 extend in the X direction and are arranged in the Y direction. The first gate wiring 132 connects to the gate electrode 122G of the first switching element 122 in each of the pixels PX1 arranged in the X direction. Each first gate wiring 132 connects to each first gate terminal 132P via the connection wiring 190. The X direction corresponds to a predetermined second direction.

The first reset gate wiring 144 supplies the scanning signal to the gate electrode 124G of the second switching element 124. The first reset gate wirings 144 extend in the X direction and are arranged in the Y direction. The first reset gate wiring 144 connects to the gate electrode 124G of the second switching element 124 in each of the pixels PX1 arranged in the X direction. Each first reset gate wiring 144 connects to each first reset gate terminal 144P via the connection wiring 190.

The first data wiring 152 sends the charge accumulated by the photoelectric conversion element E1 to the outside. The first data wirings 152 extend in the Y direction and are arranged in the X direction. The first data wiring 152 connects to the drain electrode 122D of the first switching element 122 in each of the pixels PX1 arranged in the Y direction. Each first data wiring 152 connects to each first data terminal 152P via the connection wiring 190.

The first reset wiring 164 removes the residual charge in the pixel PX1. The first reset wirings 164 extend in the Y direction and are arranged in the X direction. The first reset wiring 164 connects to the drain electrode 124D of the second switching element 124 in each of the pixels PX1 arranged in the Y direction. The first reset wirings 164 commonly connect to first reset terminals 164P via the connection wirings 190.

The first bias wiring 172 supplies a bias voltage to the photoelectric conversion element E1. The first bias wirings 172 extend in the Y direction and are arranged in the X direction. The first bias wiring 172 connects to the anode electrode of the photoelectric conversion element E1 in each of the pixels PX1 arranged in the Y direction. The first bias wirings 172 commonly connect to first bias terminals 172P via the connection wirings 190.

The second gate wirings 232, the second reset gate wirings 244, the second data wirings 252, the second reset wirings 264, and the second bias wirings 272 are disposed in the second region 110b of the imaging region 110.

The second gate wiring 232 supplies the scanning signal to the gate electrode 122G of the first switching element 122. The second gate wirings 232 extend in the X direction and are arranged in the Y direction. The second gate wiring 232 connects to the gate electrode 122G of the first switching element 122 in each of the pixels PX2 arranged in the X direction. Each second gate wiring 232 connects to each second gate terminal 132P via the connection wiring 190.

The second reset gate wiring 244 supplies the scanning signal to the gate electrode 124G of the second switching element 124. The second reset gate wirings 244 extend in the X direction and are arranged in the Y direction. The second reset gate wiring 244 connects to the gate electrode 124G of the second switching element 124 in each of the pixels PX2 arranged in the X direction. Each second reset gate wiring 244 connects to each second reset gate terminal 244P via the connection wiring 190.

The second data wiring 252 sends the charge accumulated by the photoelectric conversion element E1 to the outside. The second data wirings 252 extend in the Y direction and are arranged in the X direction. The second data wiring 252 connects to the drain electrode 122D of the first switching element 122 in each of the pixels PX2 arranged in the Y direction. Each second data wiring 252 connects to each second data terminal 252P via the connection wiring 190.

The second reset wiring 264 removes the residual charge in the pixel PX2. The second reset wirings 264 extend in the Y direction and are arranged in the X direction. The second reset wiring 264 connects to the drain electrode 124D of the second switching element 124 in each of the pixels PX2 arranged in the Y direction. The second reset wirings 264 commonly connect to second reset terminals 264P via the connection wirings 190.

The second bias wiring 272 supplies a bias voltage to the photoelectric conversion element E1. The second bias wirings 272 extend in the Y direction and are arranged in the X direction. The second bias wiring 272 connects to the anode electrode of the photoelectric conversion element E1 in each of the pixels PX2 arranged in the Y direction. The second bias wirings 272 commonly connect to second bias terminals 272P via the connection wirings 190.

The terminals of the element substrate 100 are described. The terminals are disposed in the surrounding region 112. The arrangements of the terminals are collectively described later.

The terminals that connect to the wirings disposed in the first region 110a of the imaging region 110 are described. Each first gate terminal 132P connects to each first gate wiring 132. The first gate terminals 132P are arranged in one row in the Y direction and form a first gate terminal group 132PU.

Each first reset gate terminal 144P connects to each first reset gate wiring 144. The first reset gate terminals 144P are arranged in one row in the Y direction and form a first reset gate terminal group 144PU.

Each first data terminal 152P connects to each first data wiring 152. The first data terminals 152P that connect to the first data wirings 152 disposed on the −X side are arranged in one row in the X direction and form a first data terminal group 152PU1. The first data terminals 152P that connect to the first data wirings 152 disposed on the +X side are arranged in one row in the X direction and form a first data terminal group 152PU2.

Each first reset terminal 164P connects to the plurality of first reset wirings 164. In the present embodiment, the two first reset terminals 164P are provided in the surrounding region 112, and all of the first reset wirings 164 connect to the two first reset terminals 164P.

Each first bias terminal 172P connects to the plurality of first bias wirings 172. In the present embodiment, the two first bias terminals 172P are provided in the surrounding region 112, and all of the first bias wirings 172 connect to the two first bias terminals 172P.

The terminals that connect to the wirings disposed in the second region 110b of the imaging region 110 are described. Each second gate terminal 232P connects to each second gate wiring 232. The second gate terminals 232P are arranged in one row in the Y direction and form a second gate terminal group 232PU.

Each second reset gate terminal 244P connects to each second reset gate wiring 244. The second reset gate terminals 244P are arranged in one row in the Y direction and form a second reset gate terminal group 244PU.

Each second data terminal 252P connects to each second data wiring 252. The second data terminals 252P that connect to the second data wirings 252 disposed on the −X side are arranged in one row in the X direction and form a second data terminal group 252PU1. The second data terminals 252P that connect to the second data wirings 252 disposed on the +X side are arranged in one row in the X direction and form a second data terminal group 252PU2.

Each second reset terminal 264P connects to the plurality of second reset wirings 264. In the present embodiment, the two second reset terminals 264P are provided in the surrounding region 112, and all of the second reset wirings 264 connect to the two second reset terminals 264P.

Each second bias terminal 272P connects to the plurality of second bias wirings 272. In the present embodiment, the two second bias terminals 272P are provided in the surrounding region 112, and all of the second bias wirings 272 connect to the two second bias terminals 272P.

Figure 5:
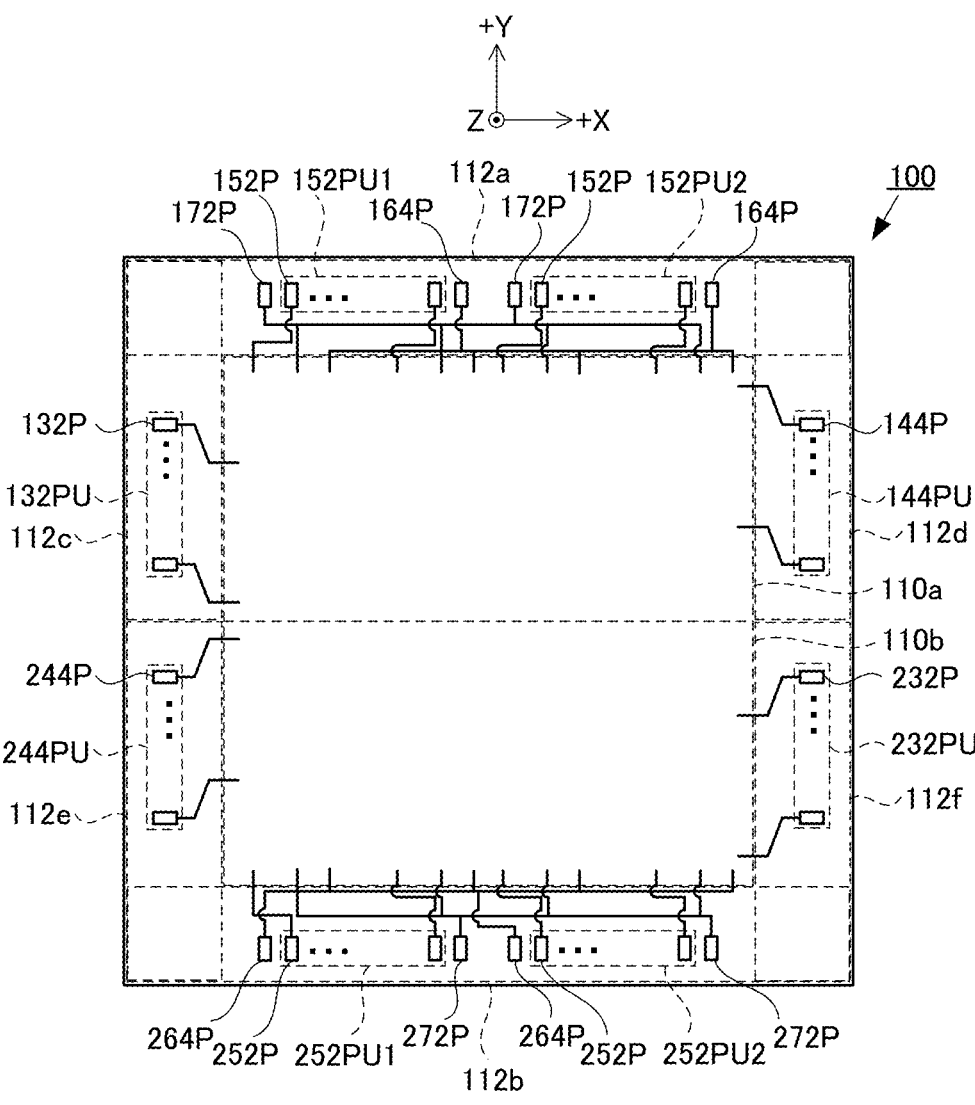
FIG. 5 is a schematic drawing for explaining the positions of terminals according to Embodiment 1.
Figure 6:
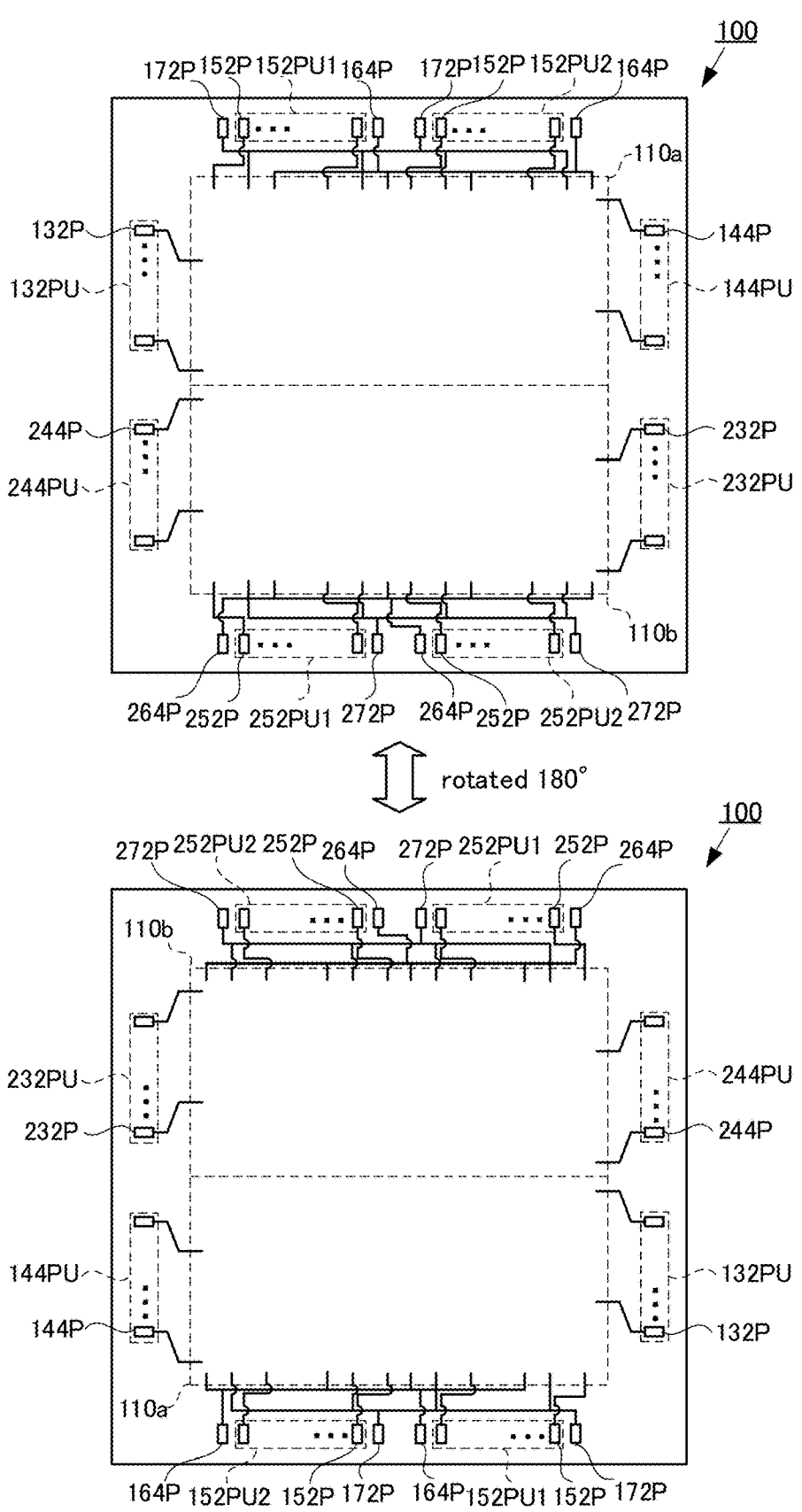
FIG. 6 is a schematic drawing for explaining the element substrate rotated 180° according to Embodiment 1.

Next, the arrangements of the terminals are described with reference to FIG. 5. In FIG. 5, the pixels PX and the wirings are omitted to facilitate understanding. In some of the following drawings as well, the pixels PX and the wirings may be omitted.

The arrangement of the first data terminals 152P (the first data terminal groups 152PU1, 152PU2), the two first reset terminals 164P, and the two first bias terminals 172P, and the arrangement of the second data terminals 252P (the second data terminal groups 252PU1, 252PU2), the two second reset terminals 264P, and the two second bias terminals 272P are described. These terminals connect to the wirings extending in the Y direction. The wirings connecting to the first data terminals 152P, the first reset terminals 164P, and the first bias terminals 172P are disposed in the first region 110a. The wirings connecting to the second data terminals 252P, the second reset terminals 264P, and the second bias terminals 272P are disposed in the second region 110b.

The first data terminals 152P, the two first reset terminals 164P, and the two first bias terminals 172P, and the second data terminals 252P, the two second reset terminals 264P, and the two second bias terminals 272P are disposed on opposite sides of the surrounding region 112 sandwiching the first region 110a and the second region 110b of the imaging region 110. Specifically, the first data terminals 152P, the two first reset terminals 164P, and the two first bias terminals 172P are disposed in a region 112a that is a region on the first region 110a side (the +Y side) included in the opposite sides of the surrounding region 112 sandwiching the first region 110a and the second region 110b. The second data terminals 252P, the two second reset terminals 264P, and the two second bias terminals 272P are disposed in a region 112b that is a region on the second region 110b side (the −Y side) included in the opposite sides of the surrounding region 112 sandwiching the first region 110a and the second region 110b.

In addition, the first data terminals 152P, the two first reset terminals 164P, and the two first bias terminals 172P disposed in the region 112a are arranged in the +X direction in order of the first bias terminal 172P, the first data terminal group 152PU1, the first reset terminal 164P, the first bias terminal 172P, the first data terminal group 152PU2, and the first reset terminal 164P. The second data terminals 252P, the two second reset terminals 264P, and the two second bias terminals 272P disposed in the region 112b are arranged in the +X direction in order of the second reset terminal 264P, the second data terminal group 252PU1, the second bias terminal 272P, the second reset terminal 264P, the second data terminal group 252PU2, and the second bias terminal 272P.

Next, the arrangement of the first gate terminals 132P (the first gate terminal group 132PU), the first reset gate terminals 144P (the first reset gate terminal group 144PU), the second gate terminals 232P (the second gate terminal group 232PU), and the second reset gate terminals 244P (the second reset gate terminal group 244PU) are described. These terminals connect to the wirings extending in the X direction. The wirings connecting to the first gate terminals 132P and the first reset gate terminals 144P are disposed in the first region 110a. The wirings connecting to the second gate terminals 232P and the second reset gate terminals 244P are disposed in the second region 110b.

The first gate terminals 132P and the first reset gate terminals 144P are disposed on opposite sides of the surrounding region 112 sandwiching the first region 110a. In the present embodiment, the first gate terminals 132P are disposed in a region 112c that is a region on the −X side included in the opposite sides sandwiching the first region 110a, and the first reset gate terminals 144P are disposed in a region 112d that is a region on the +X side included in the opposite sides sandwiching the first region 110a.

The second gate terminals 232P and the second reset gate terminals 244P are disposed on opposite sides of the surrounding region 112 sandwiching the second region 110b. In addition, the second gate terminals 232P are disposed on the same side as the first reset gate terminals 144P with respect to the imaging region 110, and the second reset gate terminals 244P are disposed on the same side as the first gate terminals 132P with respect to the imaging region 110. In the present embodiment, the second gate terminals 232P are disposed in a region 112f that is a region on the +X side included in the opposite sides sandwiching the second region 110b, and the second reset gate terminals 244P are disposed in a region 112e that is a region on the −X side included in the opposite sides sandwiching the second region 110b.

The terminals are arranged as described above, and as illustrated in FIG. 6, in a case where the element substrate 100 is rotated 180° when viewed from above, the second gate terminal group 232PU is positioned at the position of the first gate terminal group 132PU before the rotation, and the first gate terminal group 132PU is positioned at the position of the second gate terminal group 232PU before the rotation. The second reset gate terminal group 244PU is positioned at the position of the first reset gate terminal group 144PU before the rotation, and the first reset gate terminal group 144PU is positioned at the position of the second reset gate terminal group 244PU before the rotation. The second data terminal group 252PU2 is positioned at the position of the first data terminal group 152PU1 before the rotation, and the first data terminal group 152PU1 is positioned at the position of the second data terminal group 252PU2 before the rotation. The second data terminal group 252PU1 is positioned at the position of the first data terminal group 152PU2 before the rotation, and the first data terminal group 152PU2 is positioned at the position of the second data terminal group 252PU1 before the rotation. The second reset terminals 264P are positioned at the positions of the first reset terminals 164P before the rotation, and the first reset terminals 164P are positioned at the positions of the second reset terminals 264P before the rotation. The second bias terminals 272P are positioned at the positions of the first bias terminals 172P before the rotation, and the first bias terminals 172P are positioned at the positions of the second bias terminal 272P before the rotation.

In other words, in the case where the element substrate 100 is rotated 180° when viewed from above, the position of the second gate terminal group 232PU is switched with the position of the first gate terminal group 132PU, the position of the second reset gate terminal group 244PU is switched with the position of the first reset gate terminal group 144PU, the position of the second data terminal group 252PU2 is switched with the position of the first data terminal group 152PU1, the position of the second data terminal group 252PU1 is switched with the position of the first data terminal group 152PU2, the positions of the second reset terminals 264P are switched with the positions of the first reset terminals 164P, and the positions of the second bias terminals 272P are switched with the positions of the first bias terminals 172P. That is, in the case where the element substrate 100 is rotated 180° when viewed from above, the positions of the terminals that connect to the wirings disposed in the first region 110a are switched with the positions of the terminals that have the same function as the above terminals and connect to the wirings disposed in the second region 110b.

In the present embodiment, as described above, in the case where the element substrate 100 is rotated 180° when viewed from above, the positions of the terminals that connect to the wirings disposed in the first region 110a are switched with the positions of the terminals that have the same function as the above terminals and connect to the wirings disposed in the second region 110b. Thus, by rotating the element substrate 100 (the imaging element 10) 180° as illustrated in FIGS. 7 and 8, the element substrate 100 (the imaging element 10) can be inspected with one probe bar 900.

Figure 7:
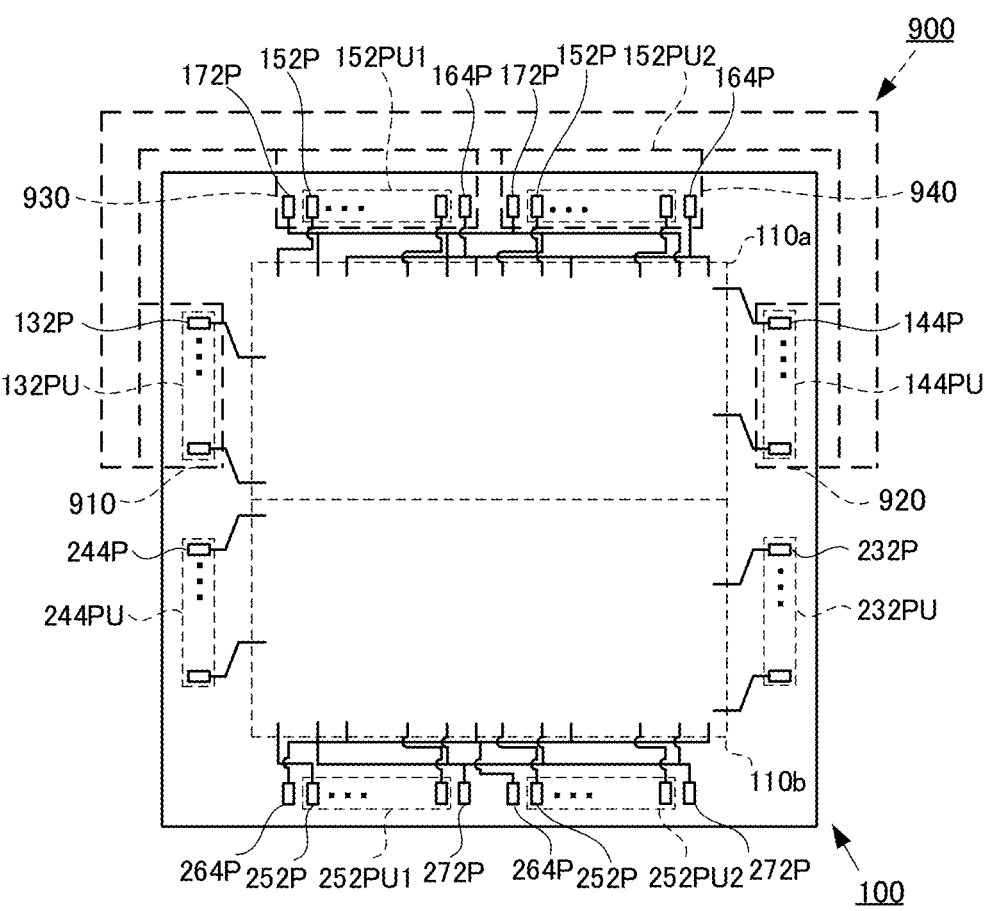
FIG. 7 is a schematic drawing for explaining a probe bar and the element substrate according to Embodiment 1.
Figure 8:
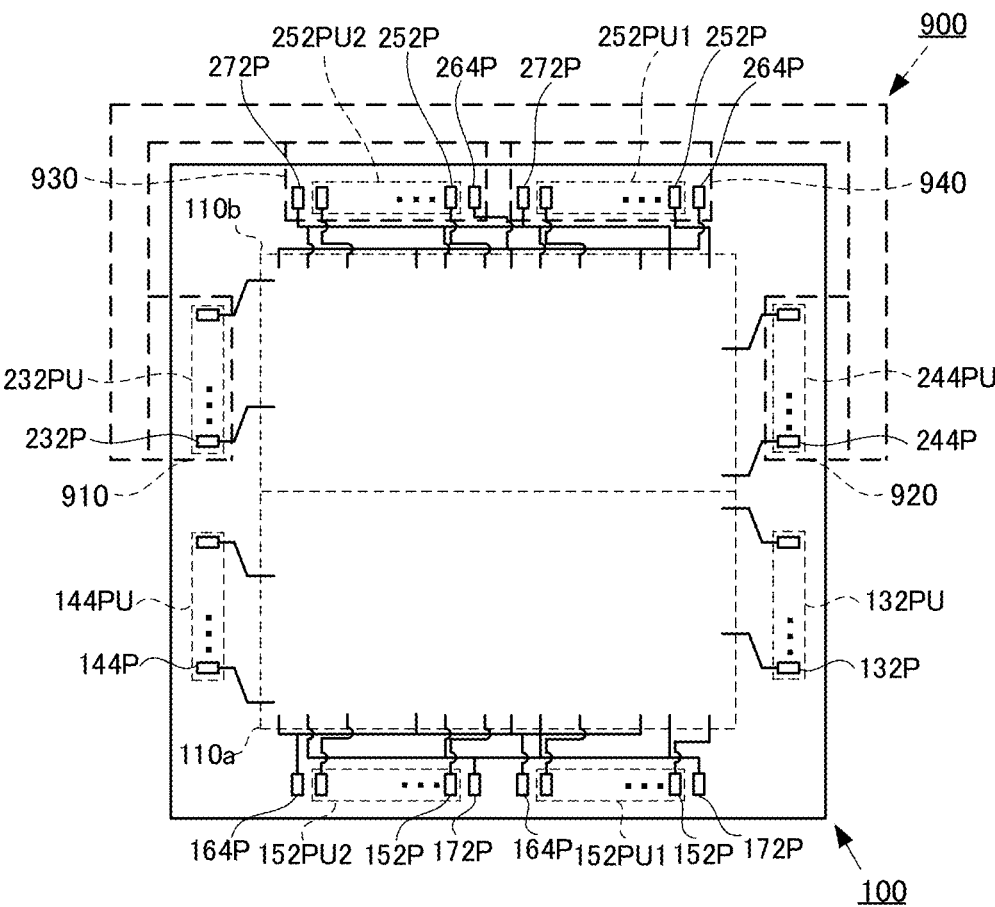
FIG. 8 is a schematic drawing for explaining the probe bar and the element substrate according to Embodiment 1.
Figure 9:
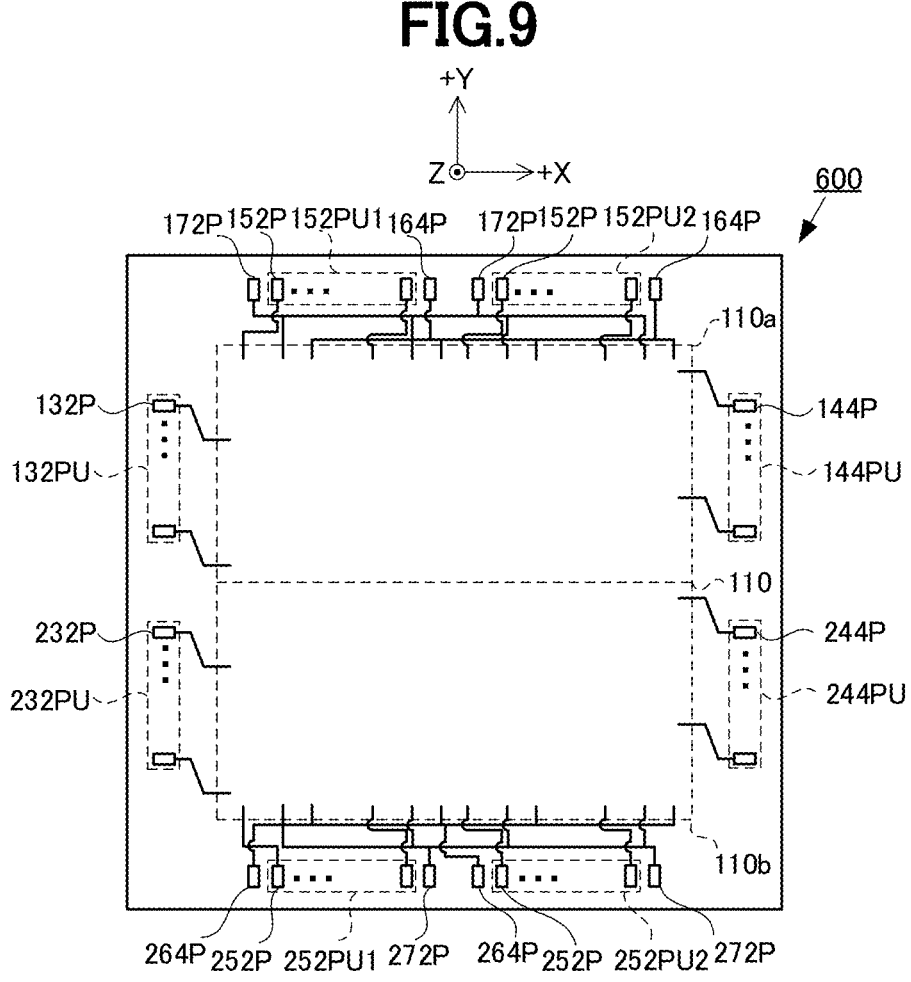
FIG. 9 is a schematic drawing illustrating an element substrate according to a comparative example.

FIGS. 7 and 8 each illustrate a state in which the position of the probe bar 900 is fixed and the element substrate 100 is rotated 180° with respect to the element substrate 100 in the other drawing. Note that, to facilitate understanding, the probe bar 900 is illustrated by dashed lines. The probe bar 900 includes probe units 910 to 940. The probe units 910 to 940 have probe pins that each correspond to any of the terminals connecting to the wirings disposed in the first region 110a and the terminals connecting to the wirings disposed in the second region 110b. The probe pins connect to a signal circuit of the probe bar 900, a controller of an inspection device, and the like. The inspection device inspects operations of the element substrate 100 (the imaging element 10) via the probe pins.

Meanwhile, in conventional arrangements of the terminals, the terminals having the same function are disposed on the same side with respect to the imaging region 110. In one example, as an element substrate 600 of a comparative example illustrated in FIG. 9, the first gate terminal group 132PU and the second gate terminal group 232PU are collectively disposed on the −X side of the imaging region 110, and the first reset gate terminal group 144PU and the second reset gate terminal group 244PU are collectively disposed on the +X side of the imaging region 110. In this case, even if the element substrate 600 is rotated 180° when viewed from above, the positions of the terminals that connect to the wirings disposed in the first region 110a are not switched with the positions of the terminals that connect to the wirings disposed in the second region 110b. Thus, to inspect both the first region 110a and the second region 110b of the element substrate 600 of the comparative example, two different probe bars are needed.

As described above, by rotating the element substrate 100 (the imaging element 10) 180° when viewed from above, both the first region 110a and the second region 110b can be inspected with the one probe bar 900 that has the probe pins corresponding to the terminals connecting to the wirings disposed in one of the first region 110a and the second region 110b. Thus, the probe bar 900 having a small number of the probe pins can be inexpensively prepared, and the element substrate 100 (the imaging element 10) can be easily inspected. That is, the inspection cost of the element substrate 100 (the imaging element 10) can be reduced.

Additionally, in the element substrate 100, the first gate terminals 132P (the first gate terminal group 132PU) and the second reset gate terminals 244P (the second reset gate terminal group 244PU) are positioned on the same side (the −X side) with respect to the imaging region 110, and the second gate terminals 232P (the second gate terminal group 232PU) and the first reset gate terminals 144P (the first reset gate terminal group 144PU) are positioned on the same side (the +X side) with respect to the imaging region 110.

Figure 10:
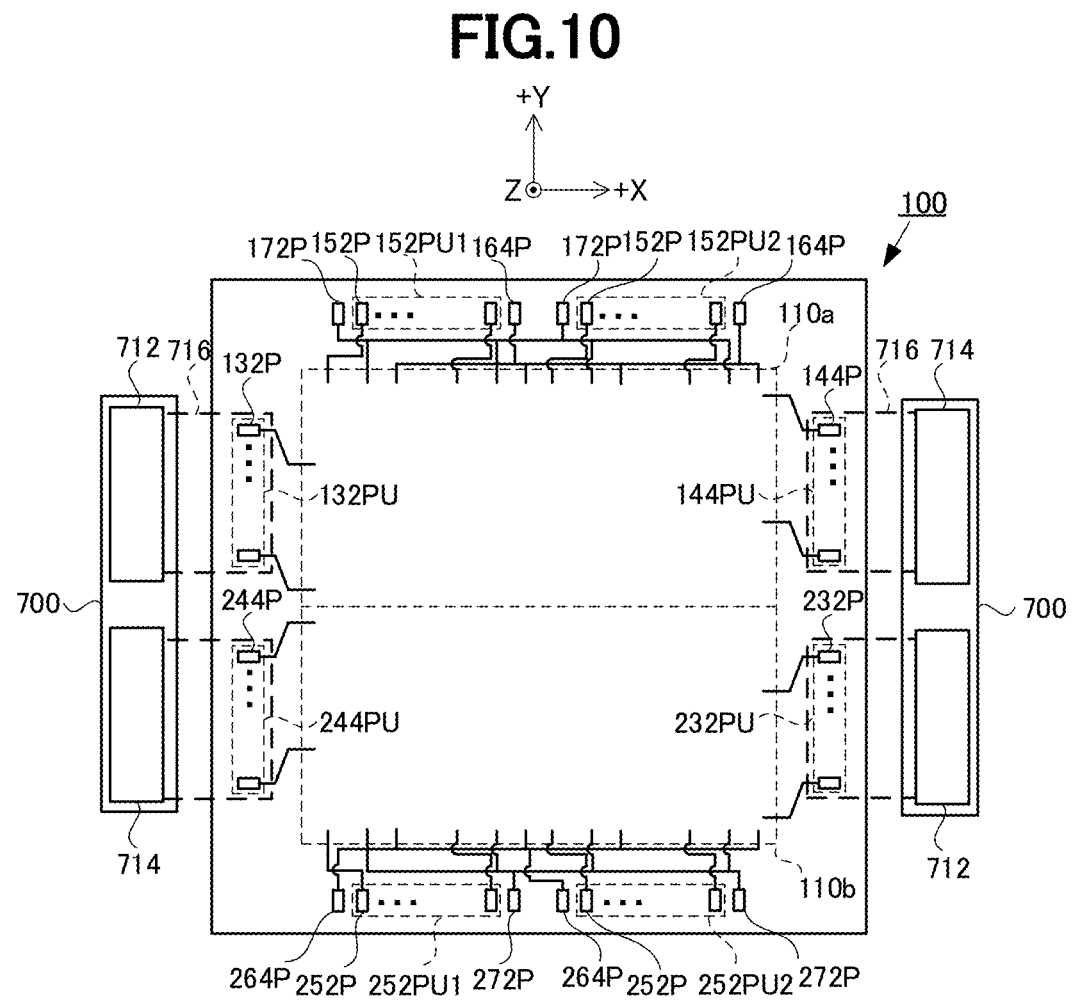

Thus, as illustrated in FIG. 10, a circuit substrate (a circuit substrate 700) having a gate drive circuit 712 that drives the gate electrode 122G of the first switching element 122 via the first gate terminal 132P and a reset gate drive circuit 714 that drives the gate electrode 124G of the second switching element 124 via the second reset gate terminal 244P may be the same as a circuit substrate (the circuit substrate 700) having the gate drive circuit 712 that drives the gate electrode 122G of the first switching element 122 via the second gate terminal 232P and the reset gate drive circuit 714 that drives the gate electrode 124G of the second switching element 124 via the first reset gate terminal 144P. Additionally, the same flexible wiring substrates 716 may be used to connect the circuit substrates 700 to the terminals. Since the same circuit substrates 700 and the same flexible wiring substrates 716 may be used, the manufacturing cost can be reduced. Note that the flexible wiring substrates 716 are illustrated by dashed lines in FIG. 10.

The operations of the imaging element 10 are described. In the present embodiment, the imaging region 110 is equally divided into two regions that are the first region 110a and the second region 110b. Thus, by independently driving the pixels PX1 in the first region 110a and the pixels PX2 in the second region 110b, the imaging element 10 can capture images at a frame rate twice the frame rate in a case where the pixels PX in the entire imaging region 110 are sequentially driven.

Here, an example of the operations is described using the first region 110a. The gate drive circuits 712 connect to the first gate wirings 132 via the first gate terminals 132P, and the reset gate drive circuits 714 connect to the first reset gate wirings 144 via the first reset gate terminals 144P. In addition, a readout circuit (not illustrated in the drawings) connect to the first data wirings 152 via the first data terminals 152P. A drain source voltage is applied to the drain electrode of the second switching element 124 via the first reset terminal 164P and the first reset wirings 164, and the bias voltage is applied to the anode electrode of the photo-electric conversion element E1 via the first bias terminal 172P and the first bias wirings 172. The readout circuit reads the charge accumulated by the photoelectric conversion element E1 or the source electrode 122S of the first switching element 122, and outputs a voltage value corresponding to the read charge to an image processing circuit (not illustrated in the drawings).

In each row in which the pixels PX1 are arranged in the X direction, a reset operation, an exposure operation, and a readout operation are sequentially performed. In the reset operation, the second switching elements 124 are in an open state on the basis of the scanning signals from the reset gate drive circuits 714. Meanwhile, the first switching elements 122 are in a close state. When the second switching elements 124 are in the open state, the residual charges in the pixels PX1 are removed, and the pixels PX1 in the row are reset. In the exposure operation, the first switching elements 122 are in the close state, and the close state of the first switching elements 122 is maintained. As a result, the charges generated in the photoelectric conversion elements E1 by visible light emitted from the scintillator SC are accumulated in the photoelectric conversion elements E1 or the source electrodes 122S of the first switching elements 122. In the readout operation, the first switching elements 122 are in the open state on the basis of the scanning signals from the gate drive circuits 712. The close state of the second switching elements 124 is maintained. As a result, the accumulated charges are sent to the readout circuit via the drain electrodes 122D of the first switching elements 122, the first data wirings 152, and the first data terminals 152P.

The pixels PX1 in the first region 110a are sequentially driven in each row by the above operations. The pixels PX2 in the second region 110b are also driven similarly to the pixels PX1 in the first region 110a, and image data expressing captured images is generated by the image processing circuit.

As described above, in the case where the element substrate 100 is rotated 180° when viewed from above, the positions of the terminals that connect to the wirings disposed in the first region 110a are switched with the positions of the terminals that have the same function as the above terminals and connect to the wirings disposed in the second region 110b. Thus, both the first region 110a and the second region 110b can be inspected with the one probe bar 900, and the inspection cost can be thus reduced.

Embodiment 2

In Embodiment 1, the wirings connecting to the pixels PX (the pixels PX1, PX2) and extending in the X direction are arranged in the +Y direction in order of the first gate wirings 132 and the first reset gate wirings 144. The wirings connecting to the pixels PX (the pixels PX1, PX2) and extending in the Y direction are arranged in the +X direction in order of the first data wirings 152, the first bias wirings 172, and the first reset wirings 164. The arrangements of the wirings connecting to the pixels PX1, PX2 are not limited thereto.

As with the imaging element 10 of Embodiment 1, the imaging element 10 of the present embodiment includes the element substrate 100 and the scintillator SC. The configuration of the scintillator SC of the present embodiment is the same as the configuration of the scintillator SC of Embodiment 1. The configuration of the element substrate 100 of the present embodiment is the same as the configuration of the element substrate 100 of Embodiment 1, except for the arrangements of the wirings and the configuration of the connection wirings 190. Here, the arrangements of the wirings and the connection wirings 190 in the element substrate 100 are described.

Figure 11:
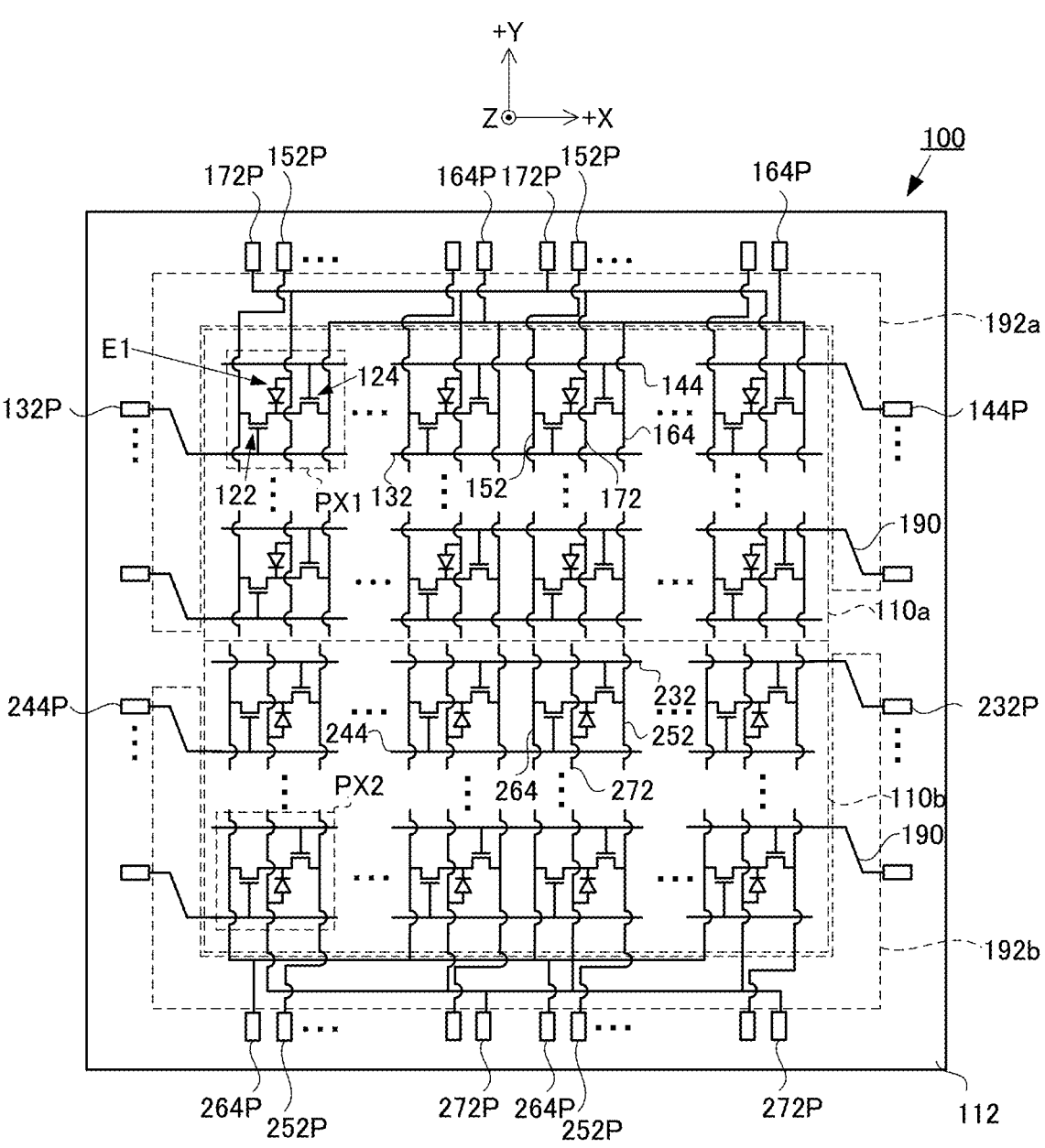
FIG. 11 is a plan view illustrating an element substrate according to Embodiment 2.
Figure 12:
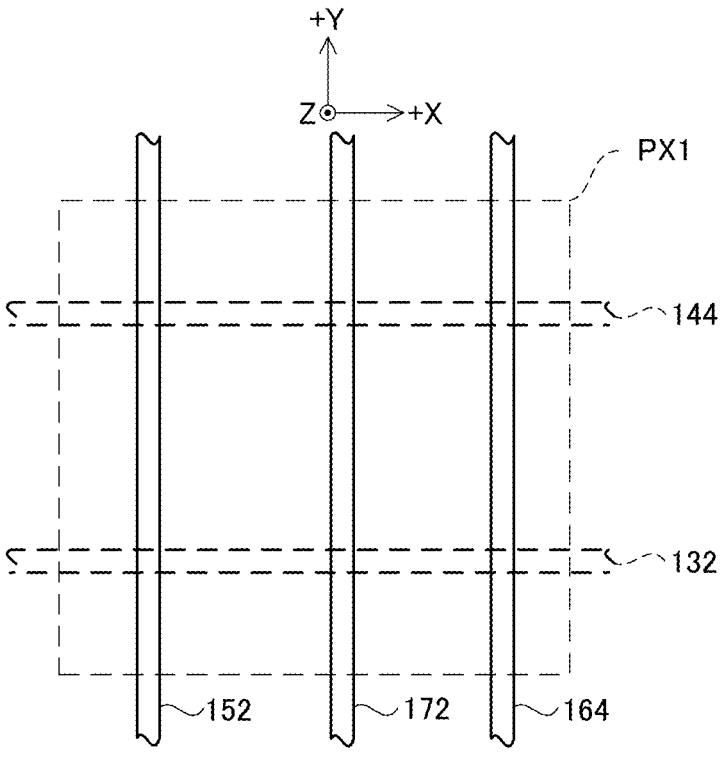
FIG. 12 is a schematic drawing illustrating wirings disposed in a first region according to Embodiment 2.

Firstly, the arrangements of the wirings (the first gate wirings 132, the first reset gate wirings 144, the first data wirings 152, the first reset wirings 164, and the first bias wirings 172) connecting to the pixels PX1 in the first region 110a of the imaging region 110 are described with reference to FIGS. 11 and 12. The first gate wiring 132 and the first reset gate wiring 144 connecting to the one pixel PX1 and extending in the X direction are arranged in the +Y direction in order of the first gate wiring 132 and the first reset gate wiring 144. The first data wiring 152, the first reset wiring 164, and the first bias wiring 172 connecting to the one pixel PX1 and extending in the Y direction are arranged in the +X direction in order of the first data wiring 152, the first bias wiring 172, and the first reset wiring 164.

Figure 13:
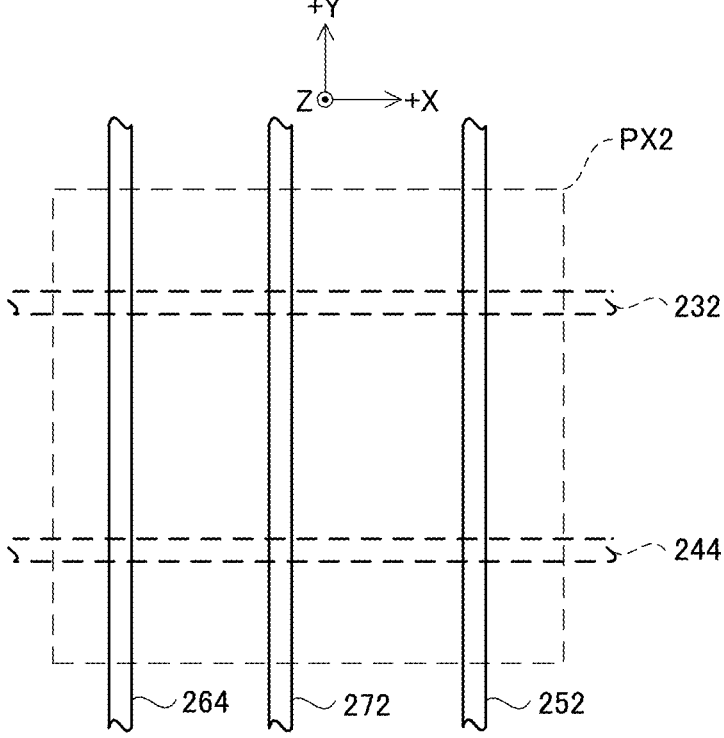
FIG. 13 is a schematic drawing illustrating wirings disposed in a second region according to Embodiment 2.

The arrangements of the wirings (the second gate wirings 232, the second reset gate wirings 244, the second data wirings 252, the second reset wirings 264, and the second bias wirings 272) connecting to the pixels PX2 in the second region 110b of the imaging region 110 are described with reference to FIGS. 11 and 13. The second gate wiring 232 and the second reset gate wiring 244 connecting to the one pixel PX2 and extending in the X direction are arranged in the +Y direction in order of the second reset gate wiring 244 and the second gate wiring 232. That is, the second gate wiring 232 and the second reset gate wiring 244 are arranged in a reverse order to the order of the first gate wiring 132 and the first reset gate wiring 144.

The second data wiring 252, the second reset wiring 264, and the second bias wiring 272 connecting to the one pixel PX2 and extending in the Y direction are arranged in the +X direction in order of the second reset wiring 264, the second bias wiring 272, and the second data wiring 252. That is, the first data wiring 152, the first reset wiring 164, and the first bias wiring 172 are arranged in a reverse order to the order of the second data wiring 252, the second reset wiring 264, and the second bias wiring 272.

As described above, in the present embodiment, the wirings in the pixel PX1 are arranged in a reverse order to the order of the wirings in the pixel PX2 that have the same function as the wirings in the pixel PX1. As illustrated in FIG. 11, this allows a wiring pattern 192a of the connection wirings 190 that connect the wirings connecting to the pixels PX1 (that is, the wirings disposed in the first region 110a) to the terminals to have the same shape as a wiring pattern 192b of the connection wirings 190 that connect the wirings connecting to the pixels PX2 (that is, the wirings disposed in the second region 110b) to the terminals. When the wiring pattern 192a and the wiring pattern 192b have the same shape, the wiring resistance and wiring capacitance of the connection wirings 190 that connect the wirings to the terminals in the first region 110a can match with the wiring resistance and wiring capacitance of the connection wirings 190 that connect the wirings to the terminals in the second region 110b, and more uniform images can be thus captured.

As described above, in the present embodiment, the wirings in one region are arranged in a reverse order to the order of the wirings in the other region that have the same function as the wirings in the one region. This allows the wiring resistance and wiring capacitance of the connection wirings 190 in the one region to match with the wiring resistance and wiring capacitance of the connection wirings 190 in the other region, and enables the imaging element 10 to capture more uniform images. In addition, as with Embodiment 1, both the first region 110a and the second region 110b can be inspected with the one probe bar 900, and the inspection cost can be thus reduced.

Embodiment 3

In the present embodiment, a mother glass substrate 400 for manufacturing the element substrate 100 is described. The mother glass substrate 400 includes, on a main surface, the imaging region 110, the surrounding region 112, and an inspection terminal region 402. The configurations of the imaging region 110, the surrounding region 112, the wirings, and the terminals of the mother glass substrate 400 are the same as the configurations of the imaging region 110, the surrounding region 112, the wirings, and the terminals of the element substrate 100 of Embodiment 1. Here, the inspection terminal region 402 is described. The element substrate 100 is manufactured by removing the inspection terminal region 402 from the mother glass substrate 400.

Figure 14:
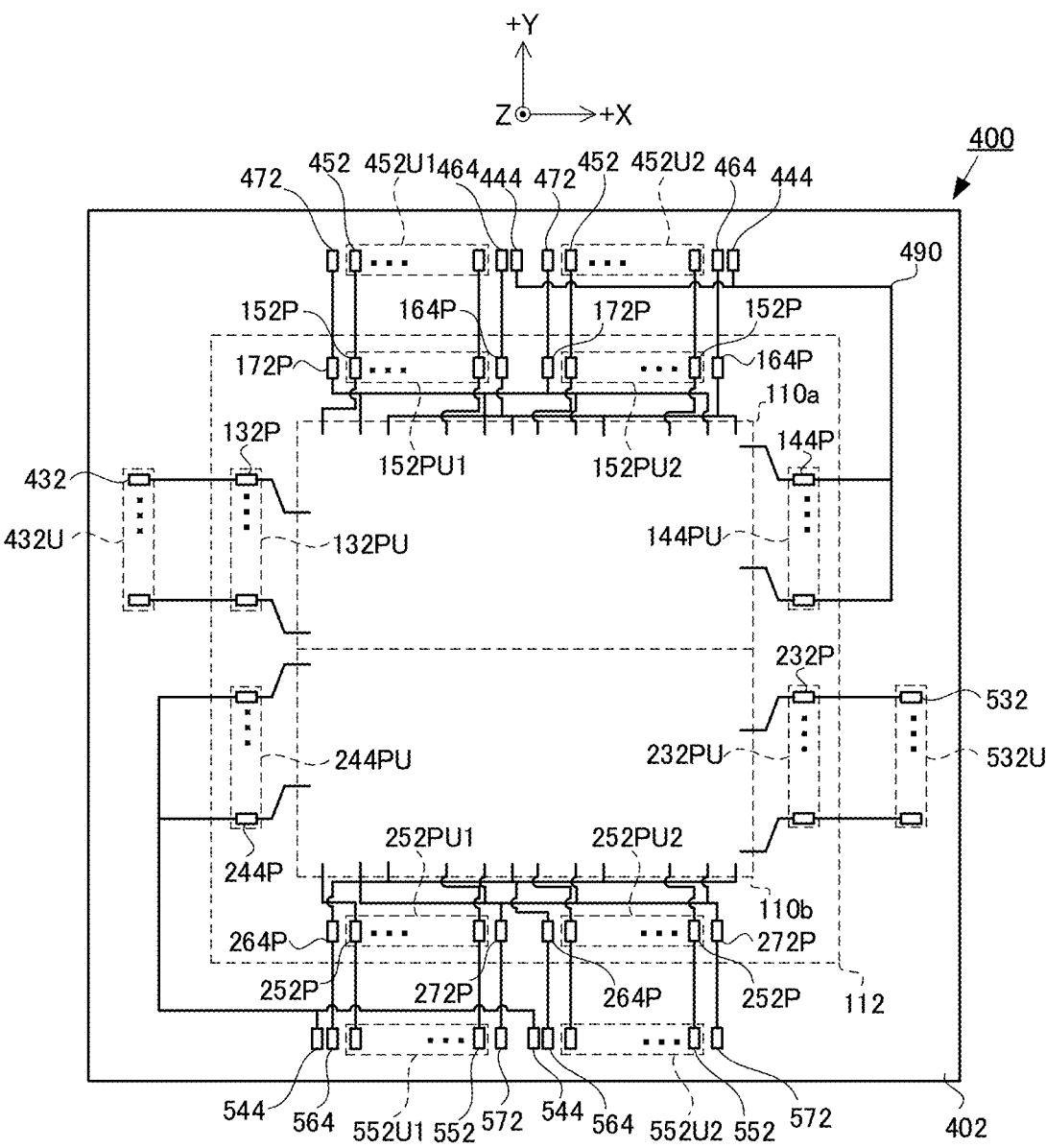
FIG. 14 is a schematic drawing illustrating a mother glass substrate according to Embodiment 3.

As illustrated in FIG. 14, the inspection terminal region 402 surrounds the surrounding region 112. Inspection terminals including first data inspection terminals 452, first gate inspection terminals 432, first reset gate inspection terminals 444, and other terminals are disposed in the inspection terminal region 402. In the present embodiment, the first data inspection terminals 452, the first gate inspection terminals 432, the first reset gate inspection terminals 444, and the other terminals are collectively referred to as the "inspection terminals". The inspection terminals connect to the wirings via the connection wirings 490 and the terminals disposed in the surrounding region 112.

Firstly, the inspection terminals connecting to the wirings disposed in the first region 110a are described. Each first data inspection terminal 452 connects to each first data terminal 152P via the connection wiring 490, and connects to each first data wiring 152 via each first data terminal 152P. The first data inspection terminals 452 are disposed outside the first data terminals 152P in the inspection terminal region 402, and the first data inspection terminals 452 and the first data terminals 152P are arranged along the Y direction. The first data inspection terminals 452 form a first data inspection terminal group 452U1 and a first data inspection terminal group 452U2 respectively corresponding to the first data terminal group 152PU1 and the first data terminal group 152PU2 that consist of the first data terminals 152P.

First reset inspection terminals 464 connect to the first reset terminals 164P via the connection wirings 490 and connect to all of the first reset wirings 164 via the first reset terminals 164P. The first reset inspection terminals 464 are disposed outside the first reset terminals 164P in the inspection terminal region 402, and the first reset inspection terminals 464 and the first reset terminals 164P are arranged along the Y direction. In the present embodiment, the two first reset inspection terminals 464 corresponding to the two first reset terminals 164P are provided in the inspection terminal region 402.

First bias inspection terminals 472 connect to the first bias terminals 172P via the connection wirings 490, and connect to all of the first bias wirings 172 via the first bias terminals 172P. The first bias inspection terminals 472 are disposed outside the first bias terminals 172P in the inspection terminal region 402, and the first bias inspection terminals 472 and the first bias terminals 172P are arranged along the Y direction. In the present embodiment, the two first bias inspection terminals 472 corresponding to the two first bias terminals 172P are provided in the inspection terminal region 402.

In the surrounding region 112, the first data terminals 152P (the first data terminal groups 152PU1, 152PU2), the first reset terminals 164P, and the first bias terminals 172P are arranged along the X direction. Thus, the first data inspection terminals 452 (the first data inspection terminal groups 452U1, 452U2), the first reset inspection terminals 464, and the first bias inspection terminals 472 are also arranged along the X direction outside the first data terminals 152P, the first reset terminals 164P, and the first bias terminals 172P in the inspection terminal region 402.

The first reset gate inspection terminals 444 connect to all of the first reset gate terminals 144P via the connection wirings 490, and connect to all of the first reset gate wirings 144 via the first reset gate terminals 144P. That is, the first reset gate wirings 144 commonly connect to the first reset gate inspection terminals 444. In the present embodiment, the two first reset gate inspection terminals 444 are provided in the inspection terminal region 402.

The first reset gate inspection terminals 444 are disposed juxtaposed to the first data inspection terminals 452, the first reset inspection terminals 464, and the first bias inspection terminals 472. Specifically, the first data inspection terminals 452, the two first reset inspection terminals 464, the two first bias inspection terminals 472, and the two first reset gate inspection terminals 444 are arranged in the +X direction in order of the first bias inspection terminal 472, the first data inspection terminal group 452U1, the first reset inspection terminal 464, the first reset gate inspection terminal 444, the first bias inspection terminal 472, the first data inspection terminal group 452U2, the first reset inspection terminal 464, and the first reset gate inspection terminal 444.

Each first gate inspection terminal 432 connects to each first gate terminal 132P via the connection wiring 490, and connects to each first gate wiring 132 via each first gate terminal 132P. The first gate inspection terminals 432 are disposed outside the first gate terminals 132P in the inspection terminal region 402, and the first gate inspection terminals 432 and the first gate terminals 132P are arranged along the X direction. The first gate inspection terminals 432 form a first gate inspection terminal group 432U corresponding to the first gate terminal group 132PU that consists of the first gate terminals 132P.

The inspection terminals connecting to the wirings disposed in the second region 110b are described. Each second data inspection terminal 552 connects to each second data terminal 252P via the connection wiring 490, and connects to each second data wiring 252 via each second data terminal 252P. The second data inspection terminals 552 are disposed outside the second data terminals 252P in the inspection terminal region 402, and the second data inspection terminals 552 and the second data terminals 252P are arranged along the Y direction. The second data inspection terminals 552 form a second data inspection terminal group 552U1 and a second data inspection terminal group 552U2 respectively corresponding to the second data terminal group 252PU1 and the second data terminal group 252PU2 that consist of the second data terminals 252P.

Second reset inspection terminals 564 connect to the second reset terminals 264P via the connection wirings 490, and connect to all of the first reset wirings 164 via the second reset terminals 264P. The second reset inspection terminals 564 are disposed outside the second reset terminals 264P in the inspection terminal region 402, and the second reset inspection terminals 564 and the second reset terminals 264P are arranged along the Y direction. In the present embodiment, the two second reset inspection terminals 564 corresponding to the two second reset terminals 264P are provided in the inspection terminal region 402.

Second bias inspection terminals 572 connect to the second bias terminals 272P via the connection wirings 490, and connect to all of the second bias wirings 272 via the second bias terminals 272P. The second bias inspection terminals 572 are disposed outside the second bias terminals 272P in the inspection terminal region 402, and the second bias inspection terminals 572 and the second bias terminals 272P are arranged along the Y direction. In the present embodiment, the two second bias inspection terminals 572 corresponding to the two second bias terminals 272P are provided in the inspection terminal region 402.

In the surrounding region 112, the second data terminals 252P (the second data terminal groups 252PU1, 252PU2), the second reset terminals 264P, and the second bias terminals 272P are arranged along the X direction. Thus, the second data inspection terminals 552 (the second data inspection terminal groups 552U1, 552U2), the second reset inspection terminals 564, and the second bias inspection terminals 572 are also arranged along the X direction outside the second data terminals 252P, the second reset terminals 264P, and the second bias terminals 272P in the inspection terminal region 402.

Second reset gate inspection terminals 544 connect to all of the second reset gate terminals 244P via the connection wirings 490, and connect to all of the second reset gate wirings 244 via the second reset gate terminals 244P. That is, the second reset gate wirings 244 commonly connect to the second reset gate inspection terminals 544. In the present embodiment, the two second reset gate inspection terminals 544 are provided in the inspection terminal region 402.

The second reset gate inspection terminals 544 are disposed juxtaposed to the second data inspection terminals 552, the second reset inspection terminals 564, and the second bias inspection terminals 572. Specifically, the second data inspection terminals 552, the two second reset inspection terminals 564, the two second bias inspection terminals 572, and the two second reset gate inspection terminals 544 are arranged in the +X direction in order of the second reset gate inspection terminal 544, the second reset inspection terminal 564, the second data inspection terminal group 552U1, the second bias inspection terminal 572, the second reset gate inspection terminal 544, the second reset inspection terminal 564, the second data inspection terminal group 552U2, and the second bias inspection terminal 572.

Each second gate inspection terminal 532 connects to each second gate terminal 232P via the connection wiring 490, and connects to each second gate wiring 232 via each second gate terminal 232P. The second gate inspection terminals 532 are disposed outside the second gate terminals 232P in the inspection terminal region 402, and the second gate inspection terminals 532 and the second gate terminals 232P are arranged along the X direction. The second gate inspection terminals 532 form a second gate inspection terminal group 532U corresponding to the second gate terminal group 232PU that consists of the second gate terminals 232P.

Figure 15:
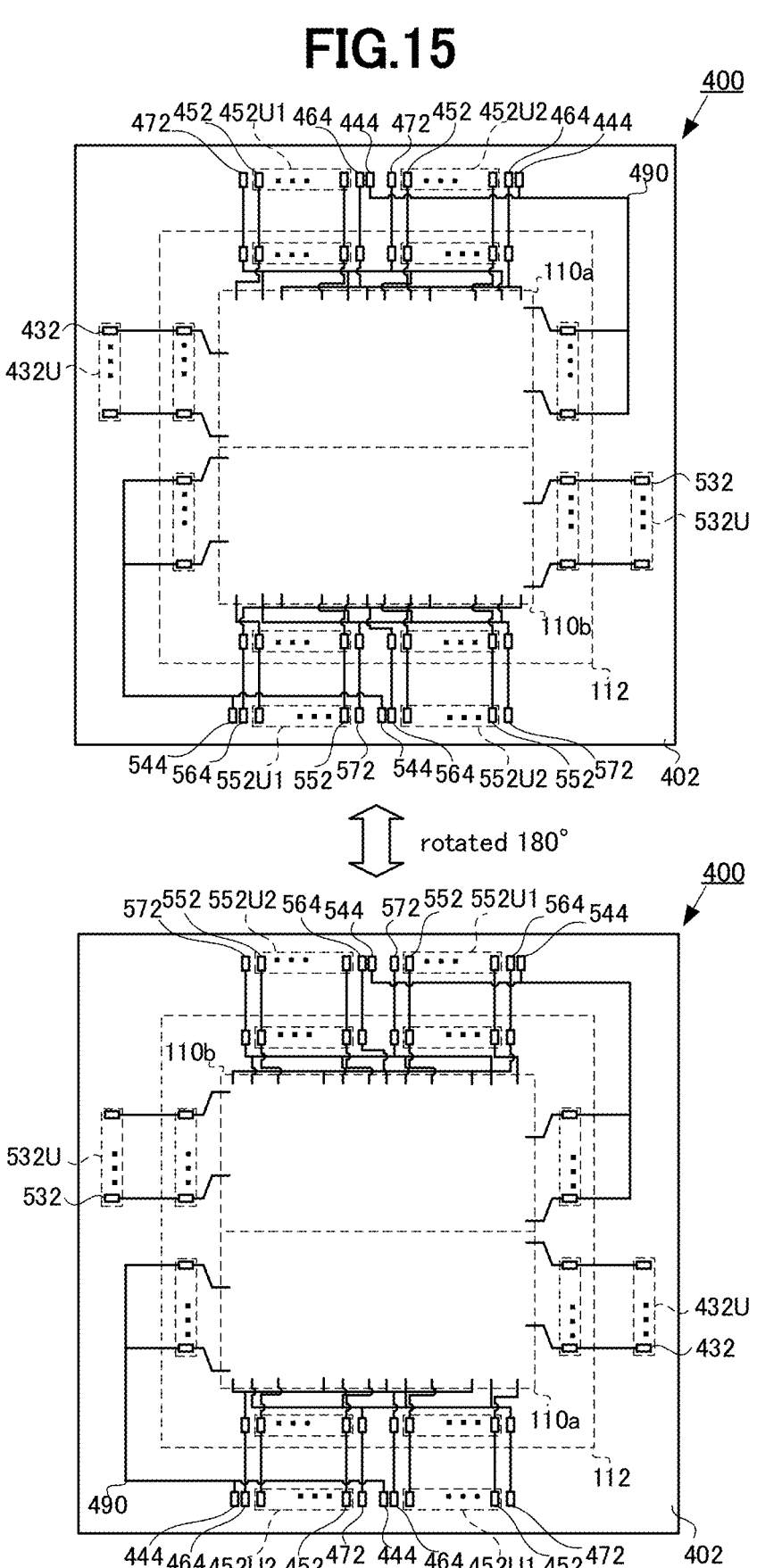
FIG. 15 is a schematic drawing for explaining the mother glass substrate rotated 180° according to Embodiment 3.

The inspection terminals are arranged as described above, and as illustrated in FIG. 15, in a case where the mother glass substrate 400 is rotated 180° when viewed from above, the position of the second gate inspection terminal group 532U is switched with the position of the first gate inspection terminal group 432U. The position of the second data inspection terminal group 552U1 is switched with the position of the first data inspection terminal group 452U2, and the position of the second data inspection terminal group 552U2 is switched with the position of the first data inspection terminal group 452U1. The positions of the second reset inspection terminals 564 are switched with the positions of the first reset inspection terminals 464, the positions of the second bias inspection terminals 572 are switched with the positions of the first bias inspection terminals 472, and the positions of the second reset gate inspection terminals 544 are switched with the positions of the first reset gate inspection terminals 444. That is, as with the element substrate 100 of Embodiment 1, the positions of the inspection terminals that connect to the wirings disposed in the first region 110a are switched with the positions of the inspection terminals that have the same function as the above inspection terminals and connect to the wirings disposed in the second region 110b.

Thus, as with the element substrate 100 (the imaging element 10), by rotating the mother glass substrate 400 180°, the imaging region 110 (the first region 110a and the second region 110b) can be inspected with the one probe bar 900 having a small number of the probe pins. In addition, since the first reset gate wirings 144 commonly connect to the first reset gate inspection terminals 444 and the second reset gate wirings 244 commonly connect to the second reset gate inspection terminals 544, the probe pins for inspection of the first reset gate wirings 144 or the second reset gate wirings 244 can be reduced. Due to these configurations, the inspection cost of the mother glass substrate 400 can be reduced. Since the first reset gate wirings 144 commonly connect to the first reset gate inspection terminals 444 and the second reset gate wirings 244 commonly connect to the second reset gate inspection terminals 544, the reset operations of the pixels PX1 and the pixels PX2 are performed at once, not in each row, in inspection of the mother glass substrate 400.

As described above, in the case where the mother glass substrate 400 is rotated 180° when viewed from above, the positions of the inspection terminals that connect to the wirings disposed in the first region 110a are switched with the positions of the inspection terminals that have the same function as the above inspection terminals and connect to the wirings disposed in the second region 110b. Thus, both the first region 110a and the second region 110b can be inspected with one probe bar having a small number of probe pins, and the inspection cost can be thus reduced.

MODIFIED EXAMPLES

Although the embodiments have been described above, various modifications can be made without departing from the sprit and scope of the present disclosure.

In one example, a configuration may be provided in which the imaging element 10 does not include the scintillator SC. In this case, the photoelectric conversion element converts the X-rays to the charge.

In Embodiments 1 and 2, the element substrate 100 has the two first reset terminals 164P. It is sufficient that the element substrate 100 has the at least one first reset terminal 164P. Additionally, it is sufficient that the element substrate 100 has the at least one second reset terminal 264P. It is sufficient that the element substrate 100 has the at least one first bias terminal 172P. It is sufficient that the element substrate 100 has the at least one second bias terminal 272P.

In Embodiment 3, the mother glass substrate 400 has the two first reset gate inspection terminals 444. It is sufficient that the mother glass substrate 400 has the at least one first reset gate inspection terminal 444. Additionally, it is sufficient that the mother glass substrate 400 has the at least one second reset gate inspection terminal 544.

Figure 16:
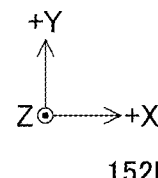
FIG. 16 is a plan view illustrating an element substrate according to a modified example.

In the element substrate 100 of Embodiment 1, as illustrated in FIG. 16, the first reset wiring 164 may connect to the second reset wiring 264. This allows the charges in the pixels PX to be removed even when any of the first reset wirings 164 and the second reset wirings 264 disconnects.

In the element substrate 100 of Embodiment 1, the first bias wiring 172 may connect to the second bias wiring 272. This allows the bias voltage to be supplied to the photoelectric conversion element E1 even when any of the first bias wirings 172 and the second bias wirings 272 disconnects.

Figure 17:
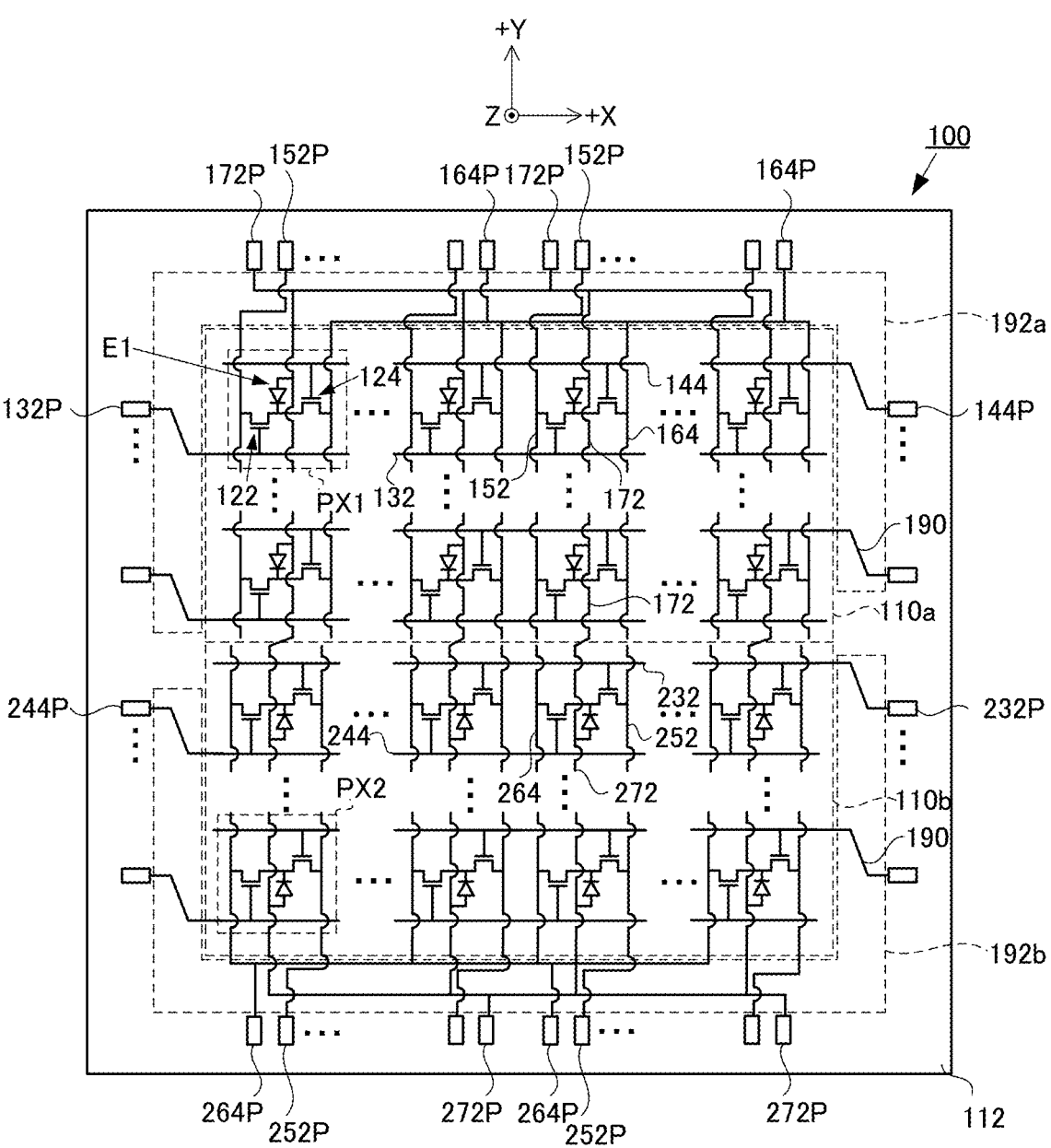
FIG. 17 is a plan view illustrating the element substrate according to a modified example.

In the element substrate 100 of Embodiment 2, as illustrated in FIG. 17, the first bias wiring 172 arranged between the first data wiring 152 and the first reset wiring 164 may connect to the second bias wiring 272 arranged between the second reset wiring 264 and the second data wiring 252. This allows the bias voltage to be supplied to the photoelectric conversion element E1 even when any of the first bias wirings 172 and the second bias wirings 272 disconnects.

The mother glass substrate 400 of Embodiment 3 includes the first gate inspection terminals 432 and the second gate inspection terminals 532. A configuration may be provided in which the mother glass substrate 400 does not include the first gate inspection terminals 432 and the second gate inspection terminals 532. In this case, instead of the first gate inspection terminals 432 and the second gate inspection terminals 532, the first gate terminals 132P and the second gate terminals 232P are used in inspection.

The mother glass substrate 400 of Embodiment 3 may include the imaging region 110 and the surrounding region 112 of Embodiment 3 instead of the imaging region 110 and the surrounding region 112 of Embodiment 1.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

The invention claimed is:

1. An imaging element having an imaging region divided in a predetermined first direction into two regions and a surrounding region surrounding the imaging region, the two regions being a first region and a second region, the imaging element comprising:

a plurality of pixels disposed in the imaging region, each of the plurality of pixels including a first switching element, a second switching element, and a photoelectric conversion element, the photoelectric conversion element connecting to a source electrode of the first switching element and a source electrode of the second switching element;

a plurality of first gate wirings disposed in the first region, each of the plurality of first gate wirings connecting to a gate electrode of the first switching element in a pixel included in the plurality of pixels and disposed in the first region, extending in a predetermined second direction, and connecting to each of a plurality of first gate terminals disposed in the surrounding region, the predetermined second direction being perpendicular to the predetermined first direction;

a plurality of first reset gate wirings disposed in the first region, each of the plurality of first reset gate wirings connecting to a gate electrode of the second switching element in the pixel disposed in the first region, extending in the predetermined second direction, and connecting to each of a plurality of first reset gate terminals disposed in the surrounding region;

a plurality of first data wirings disposed in the first region, each of the plurality of first data wirings connecting to a drain electrode of the first switching element in the pixel disposed in the first region, extending in the predetermined first direction, and connecting to each of a plurality of first data terminals disposed in the surrounding region;

a plurality of first reset wirings disposed in the first region, each of the plurality of first reset wirings connecting to a drain electrode of the second switching element in the pixel disposed in the first region, extending in the predetermined first direction, and connecting to a first reset terminal disposed in the surrounding region;

a plurality of first bias wirings disposed in the first region, each of the plurality of first bias wirings connecting to the photoelectric conversion element in the pixel disposed in the first region, extending in the predetermined first direction, and connecting to a first bias terminal disposed in the surrounding region;

a plurality of second gate wirings disposed in the second region, each of the plurality of second gate wirings connecting to a gate electrode of the first switching element in a pixel included in the plurality of pixels and disposed in the second region, extending in the predetermined second direction, and connecting to each of a plurality of second gate terminals disposed in the surrounding region;

a plurality of second reset gate wirings disposed in the second region, each of the plurality of second reset gate wirings connecting to a gate electrode of the second switching element in the pixel disposed in the second region, extending in the predetermined second direction, and connecting to each of a plurality of second reset gate terminals disposed in the surrounding region;

a plurality of second data wirings disposed in the second region, each of the plurality of second data wirings connecting to a drain electrode of the first switching element in the pixel disposed in the second region, extending in the predetermined first direction, and connecting to each of a plurality of second data terminals disposed in the surrounding region;

a plurality of second reset wirings disposed in the second region, each of the plurality of second reset wirings connecting to a drain electrode of the second switching element in the pixel disposed in the second region, extending in the predetermined first direction, and connecting to a second reset terminal disposed in the surrounding region; and a plurality of second bias wirings disposed in the second region, each of the plurality of second bias wirings connecting to the photoelectric conversion element in the pixel disposed in the second region, extending in the predetermined first direction, and connecting to a second bias terminal disposed in the surrounding region, wherein the plurality of first gate terminals and the plurality of first reset gate terminals are disposed on opposite sides of the surrounding region sandwiching the first region, the plurality of second gate terminals and the plurality of second reset gate terminals are disposed on opposite sides of the surrounding region sandwiching the second region, the plurality of first gate terminals and the plurality of second reset gate terminals are disposed on a same side of the surrounding region with respect to the imaging region, the plurality of first reset gate terminals and the plurality of second gate terminals are disposed on a same side of the surrounding region with respect to the imaging region, and in a case where the imaging element is rotated 180° when viewed from above, positions of the plurality of first gate terminals are switched with positions of the plurality of second gate terminals, positions of the plurality of first reset gate terminals are switched with positions of the plurality of second reset gate terminals, positions of the plurality of first data terminals are switched with positions of the plurality of second data terminals, a position of the first reset terminal is switched with a position of the second reset terminal, and a position of the first bias terminal is switched with a position of the second bias terminal.

2. The imaging element according to claim 1, wherein the plurality of first data terminals, the first reset terminal, and the first bias terminal are disposed on a first region side of the surrounding region, the first region side being included in opposite sides of the surrounding region sandwiching the first region and the second region, and the plurality of second data terminals, the second reset terminal, and the second bias terminal are disposed on a second region side of the surrounding region, the second region side being included in the opposite sides of the surrounding region sandwiching the first region and the second region.

3. The imaging element according to claim 1, wherein a first reset wiring of the plurality of first reset wirings connects to a second reset wiring of the plurality of second reset wirings.

4. The imaging element according to claim 1, wherein a first bias wiring of the plurality of first bias wirings connects to a second bias wiring of the plurality of second bias wirings.

5. The imaging element according to claim 3, wherein a first bias wiring of the plurality of first bias wirings connects to a second bias wiring of the plurality of second bias wirings.

6. The imaging element according to claim 1, wherein an arrangement order, in the predetermined first direction, of a first gate wiring of the plurality of first gate wirings and a first reset gate wiring of the plurality of first reset gate wirings connecting to the one pixel disposed in the first region is reverse to an arrangement order, in the predetermined first direction, of a second gate wiring of the plurality of second gate wirings and a second reset gate wiring of the plurality of second reset gate wirings connecting to the one pixel disposed in the second region, and an arrangement order, in the predetermined second direction, of a first data wiring of the plurality of first data wirings, a first reset wiring of the plurality of first reset wirings, and a first bias wiring of the plurality of first bias wirings connecting to the one pixel disposed in the first region is reverse to an arrangement order, in the predetermined second direction, of a second data wiring of the plurality of second data wirings, a second reset wiring of the plurality of second reset wirings, and a second bias wiring of the plurality of second bias wirings connecting to the one pixel disposed in the second region.

7. The imaging element according to claim 6, wherein the first bias wiring is positioned between the first data wiring and the first reset wiring, the second bias wiring is positioned between the second data wiring and the second reset wiring, and the first bias wiring connects to the second bias wiring.

8. A mother glass substrate having an imaging region divided in a predetermined first direction into two regions, a surrounding region surrounding the imaging region, and an inspection terminal region surrounding the surrounding region, the two regions being a first region and a second region, the mother glass substrate comprising:

a plurality of pixels disposed in the imaging region, each of the plurality of pixels including a first switching element, a second switching element, and a photoelectric conversion element, the photoelectric conversion element connecting to a source electrode of the first switching element and a source electrode of the second switching element;

a plurality of first gate wirings disposed in the first region, each of the plurality of first gate wirings connecting to a gate electrode of the first switching element in a pixel included in the plurality of pixels and disposed in the first region, extending in a predetermined second direction, and connecting to each of a plurality of first gate terminals disposed in the surrounding region, the predetermined second direction being perpendicular to the predetermined first direction;

a plurality of first reset gate wirings disposed in the first region, each of the plurality of first reset gate wirings connecting to a gate electrode of the second switching element in the pixel disposed in the first region, extending in the predetermined second direction, and connecting to each of a plurality of first reset gate terminals disposed in the surrounding region;

a plurality of first data wirings disposed in the first region, each of the plurality of first data wirings connecting to a drain electrode of the first switching element in the pixel disposed in the first region, extending in the predetermined first direction, and connecting to each of a plurality of first data terminals disposed in the surrounding region;

a plurality of first reset wirings disposed in the first region, each of the plurality of first reset wirings connecting to a drain electrode of the second switching element in the pixel disposed in the first region, extending in the predetermined first direction, and connecting to a first reset terminal disposed in the surrounding region;

a plurality of first bias wirings disposed in the first region, each of the plurality of first bias wirings connecting to the photoelectric conversion element in the pixel disposed in the first region, extending in the predetermined first direction, and connecting to a first bias terminal disposed in the surrounding region;

a plurality of second gate wirings disposed in the second region, each of the plurality of second gate wirings connecting to a gate electrode of the first switching element in a pixel included in the plurality of pixels and disposed in the second region, extending in the predetermined second direction, and connecting to each of a plurality of second gate terminals disposed in the surrounding region;

a plurality of second reset gate wirings disposed in the second region, each of the plurality of second reset gate wirings connecting to a gate electrode of the second switching element in the pixel disposed in the second region, extending in the predetermined second direction, and connecting to each of a plurality of second reset gate terminals disposed in the surrounding region;

a plurality of second data wirings disposed in the second region, each of the plurality of second data wirings connecting to a drain electrode of the first switching element in the pixel disposed in the second region, extending in the predetermined first direction, and connecting to each of a plurality of second data terminals disposed in the surrounding region;

a plurality of second reset wirings disposed in the second region, each of the plurality of second reset wirings connecting to a drain electrode of the second switching element in the pixel disposed in the second region, extending in the predetermined first direction, and connecting to a second reset terminal disposed in the surrounding region;

a plurality of second bias wirings disposed in the second region, each of the plurality of second bias wirings connecting to the photoelectric conversion element in the pixel disposed in the second region, extending in the predetermined first direction, and connecting to a second bias terminal disposed in the surrounding region;

a first reset gate inspection terminal connecting to the plurality of first reset gate terminals and disposed in the inspection terminal region;

a plurality of first data inspection terminals disposed in the inspection terminal region, each of the plurality of first data inspection terminals connecting to each of the plurality of first data terminal;

a first reset inspection terminal connecting to the first reset terminal and disposed in the inspection terminal region;

a first bias inspection terminal connecting to the first bias terminal and disposed in the inspection terminal region;

a second reset gate inspection terminal connecting to the plurality of second reset gate terminals and disposed in the inspection terminal region;

a plurality of second data inspection terminals disposed in the inspection terminal region, each of the plurality of second data inspection terminals connecting to each of the plurality of second data terminals;

a second reset inspection terminal connecting to the second reset terminal and disposed in the inspection terminal region; and a second bias inspection terminal connecting to the second bias terminal and disposed in the inspection terminal region, wherein the plurality of first data terminals, the first reset terminal, and the first bias terminal are disposed on a first region side of the surrounding region, the first region side being included in opposite sides of the surrounding region sandwiching the first region and the second region, the plurality of second data terminals, the second reset terminal, and the second bias terminal are disposed on a second region side of the surrounding region, the second region side being included in the opposite sides of the surrounding region sandwiching the first region and the second region, the plurality of first gate terminals and the plurality of first reset gate terminals are disposed on opposite sides of the surrounding region sandwiching the first region, the plurality of second gate terminals and the plurality of second reset gate terminals are disposed on opposite sides of the surrounding region sandwiching the second region, the plurality of first gate terminals and the plurality of second reset gate terminals are disposed on a same side of the surrounding region with respect to the imaging region, and the plurality of first reset gate terminals and the plurality of second gate terminals are disposed on a same side of the surrounding region with respect to the imaging region, the plurality of first data inspection terminals, the first reset inspection terminal, and the first bias inspection terminal are respectively disposed outside the plurality of first data terminals, the first reset terminal, and the first bias terminal, the plurality of second data inspection terminals, the second reset inspection terminal, and the second bias inspection terminal are respectively disposed outside the plurality of second data terminals, the second reset terminal, and the second bias terminal, the plurality of first reset gate inspection terminals are disposed juxtaposed to the plurality of first data inspection terminals, the first reset inspection terminal, and the first bias inspection terminal, the plurality of second reset gate inspection terminals are disposed juxtaposed to the plurality of second data inspection terminals, the second reset inspection terminal, and the second bias inspection terminal, and in a case where the mother glass substrate is rotated 180° when viewed from above, positions of the plurality of first data inspection terminals are switched with positions of the plurality of second data inspection terminals, a position of the first reset inspection terminal is switched with a position of the second reset inspection terminal, a position of the first bias inspection terminal is switched with a position of the second bias inspection terminal, and positions of the plurality of first reset gate inspection terminals are switched with positions of the plurality of second reset gate inspection terminals.

9. The mother glass substrate according to claim 8, wherein a first reset wiring of the plurality of first reset wirings connects to a second reset wiring of the plurality of second reset wirings.

10. The mother glass substrate according to claim 8, wherein a first bias wiring of the plurality of first bias wirings connects to a second bias wiring of the plurality of second bias wirings.

11. The mother glass substrate according to claim 9, wherein a first bias wiring of the plurality of first bias wirings connects to a second bias wiring of the plurality of second bias wirings.

12. The mother glass substrate according to claim 8, further comprising:

a plurality of first gate inspection terminals disposed in the inspection terminal region, each of the plurality of first gate inspection terminals connecting to each of the plurality of first gate terminals; and a plurality of second gate inspection terminals disposed in the inspection terminal region, each of the plurality of second gate inspection terminals connecting to each of the plurality of second gate terminals, wherein the plurality of first gate terminals are disposed outside the plurality of first gate terminals, the plurality of second gate terminals are disposed outside the plurality of second gate terminals, and in a case where the mother glass substrate is rotated 180° when viewed from above, positions of the plurality of first gate inspection terminals are switched with positions of the plurality of second gate inspection terminals.

13. The mother glass substrate according to claim 8, wherein an arrangement order, in the predetermined first direction, of a first gate wiring of the plurality of first gate wirings and a first reset gate wiring of the plurality of first reset gate wirings connecting to the one pixel disposed in the first region is reverse to an arrangement order, in the predetermined first direction, of a second gate wiring of the plurality of second gate wirings and a second reset gate wiring of the plurality of second reset gate wirings connecting to the one pixel disposed in the second region, and an arrangement order, in the predetermined second direction, of a first data wiring of the plurality of first data wirings, a first reset wiring of the plurality of first reset wirings, and a first bias wiring of the plurality of first bias wirings connecting to the one pixel disposed in the first region is reverse to an arrangement order, in the predetermined second direction, of a second data wiring of the plurality of second data wirings, a second reset wiring of the plurality of second reset wirings, and a second bias wiring of the plurality of second bias wirings connecting to the one pixel disposed in the second region.

14. The mother glass substrate according to claim 13, wherein a first bias wiring of the plurality of first bias wirings connects to a second bias wiring of the plurality of second bias wirings.

\* \* \* \* \*